(12) United States Patent
Cheng et al.

(10) Patent No.: US 7,384,829 B2
(45) Date of Patent: Jun. 10, 2008

(54) PATTERNED STRAINED SEMICONDUCTOR SUBSTRATE AND DEVICE

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 10/710,608

(22) Filed: Jul. 23, 2004

(65) Prior Publication Data

US 2006/0019462 A1    Jan. 26, 2006

(51) Int. Cl.
*H01L 21/00* (2006.01)

(52) U.S. Cl. .............. 438/153; 438/152; 438/223; 438/224

(58) Field of Classification Search ........... 438/152, 438/153, 223, 224
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |

(Continued)

FOREIGN PATENT DOCUMENTS

JP    64-76755    3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner*—Bradley W. Baumeister
*Assistant Examiner*—Matthew L Reames
(74) *Attorney, Agent, or Firm*—Joseph P. Abate; Greenblum & Bernstein P.L.C.

(57) ABSTRACT

A method that includes forming a pattern of strained material and relaxed material on a substrate; forming a strained device in the strained material; and forming a non-strained device in the relaxed material is disclosed. In one embodiment, the strained material is silicon (Si) in either a tensile or compressive state, and the relaxed material is Si in a normal state. A buffer layer of silicon germanium (SiGe), silicon carbon (SiC), or similar material is formed on the substrate and has a lattice constant/structure mis-match with the substrate. A relaxed layer of SiGe, SiC, or similar material is formed on the buffer layer and places the strained material in the tensile or compressive state. In another embodiment, carbon-doped silicon or germanium-doped silicon is used to form the strained material. The structure includes a multi-layered substrate having strained and non-strained materials patterned thereon.

6 Claims, 39 Drawing Sheets

U.S. PATENT DOCUMENTS

| | | |
|---|---|---|
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,509,618 B2 | 7/2003 | Jan et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0003364 A1* | 6/2001 | Sugawara et al. .......... 257/192 |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0219937 A1* | 11/2003 | Peterson et al. ............ 438/184 |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI I-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si n-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

Kern Rim, et al., "Transconductance Enhancement in Deep Submicron Strained-Si n-MOSFETs". International Electron Devices Meeting, 26, 8, 1, IEEE, Sep. 1998.

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx Sl I-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

* cited by examiner

PATTERNED STRAINED SEMICONDUCTOR SUBSTRATE AND DEVICE

BACKGROUND OF INVENTION

The invention relates to methods and structures for manufacturing semiconductor devices having improved device performances, and more particularly, to methods and structures for forming patterns of strained and non-strained areas on a substrate.

Emerging technologies, such as embedded Dynamic Random Access Memory (eDRAM), Application Specific Integrated Circuits (ASIC), and system-on-chip (SoC), require the combination of high-performance logic devices and memory devices on the same chip. It is also desired to have digital circuits and analog circuits on the same chip for some applications. It has been shown that logic devices exhibit better performance when formed on a tensily strained silicon layer that is epitaxially grown on another epitaxially grown silicon germanium (SiGe) layer that has been relaxed.

A fully relaxed SiGe layer has a lattice constant which is larger than that of silicon. Thus, when the silicon layer is epitaxially grown thereon, the silicon layer conforms to the larger lattice constant of the relaxed SiGe layer and this applies physical biaxial stress to the silicon layer being formed thereon. This physical biaxial stress applied to the silicon layer increases the performance of logic devices formed in the strained silicon.

Relaxation in SiGe on silicon substrates occurs through the formation of misfit dislocations, which when equally spaced to relieve stress cause the substrate to be perfectly relaxed. Additionally, the misfit dislocations provide extra half-planes of silicon in the substrate. This allows the lattice constant in the SiGe layer to seek its intrinsic value. In this manner, the SiGe lattice constant grows larger as the mismatch strain across the SiGe/silicon interface is accommodated.

The problem with this approach is that it requires a very thick, multilayered SiGe layer. Additionally, the misfit dislocations formed between the SiGe layer and the epitaxial silicon layer are random, highly non-uniform in density, and fairly uncontrollable due to heterogeneous nucleation that cannot be easily controlled. Consequently, the physical stress applied to the silicon layer is apt to be defective. At locations where misfit density is high, defects form in the strained silicon layer. These defects short device terminals and cause other leakage problems. For this reason, although the performance of logic devices is strengthened when the logic devices are formed in areas of strained silicon, the performance of defect-sensitive devices such as DRAM devices degrades when formed therein. The production yield is also compromised when the defect-sensitive devices are formed in the strained regions. Thus a need exists for a method of (and a substrate for) manufacturing strained and non-strained silicon regions on the same chip so that high-performance logic devices can be made in the strained silicon regions and high quality, defect-sensitive devices can be made in the non-strained regions.

SUMMARY OF INVENTION

In one aspect of the invention, a method for forming an electrical device is provided. The method includes forming a pattern of strained material and non-strained (relaxed) material on a substrate. The method further includes forming a strained device in the strained material. The method yet further includes forming a non-strained device in the non-strained material.

In another aspect of the invention, another method for forming an electrical device is provided. The method includes forming a buffer layer in contact with a portion of a substrate. The buffer layer has a lattice constant/structure mismatch with the substrate. The method also includes forming a relaxed layer on the buffer layer. The method further includes forming a strained material on a top surface of the relaxed layer. The relaxed layer places the strained material in one of a tensile or a compressive state. The method yet further includes patterning a non-strained (relaxed) material proximate the strained material.

In still another aspect of the invention, an electrical device is provided. The device includes a substrate. The device further includes a pattern of strained material and relaxed material formed on the substrate. The device yet further includes a strained device formed in the strained material. The device still further includes a non-strained device formed in the relaxed material.

In yet another aspect of the invention, another electrical device is provided. The electrical device includes a buffer layer formed in contact with a portion of a substrate. The buffer layer has a lattice constant/structure mismatch with the substrate. The device further includes a relaxed layer formed on the buffer layer. The device also includes a strained material formed on a top surface of the relaxed layer. The relaxed layer places the strained material in one of a tensile or a compressive state. The device still further includes a non-strained material patterned proximate the strained material.

DETAILED DESCRIPTION

The invention is directed to an electrical, digital, semiconductor, or other device having a substrate on which a pattern of strained and non-strained (i.e., relaxed) materials are formed. The strained material may be placed in tension or compression due to a lattice constant/structure difference with an underlying layer of relaxed material. In turn, the relaxed material is formed on a buffer layer, which contacts a portion of the substrate.

A material forming the buffer layer varies in concentration throughout the layer, and has a lattice constant/structure mismatch with the material that forms the substrate. Because the material forming the buffer layer increases in concentration the further the buffer layer extends from the substrate, defects normally caused by the lattice mis-match are virtually eliminated. The formation of the relaxed layer on the buffer layer further reduces and/or eliminates defects to such an extent that the strained material is virtually free of defects. The drastic reduction or elimination of defects in the strained material allows electronic or digital devices formed therein to operate very fast and very efficiently. It also allows devices such as Dynamic Random Access Memory (DRAM) to be formed in an adjacent relaxed material because such devices are normally very sensitive to defects. Thus, embodiments of the invention permit the forming of strained logic devices and non-strained memory devices side by side on the same substrate.

Figure 1:
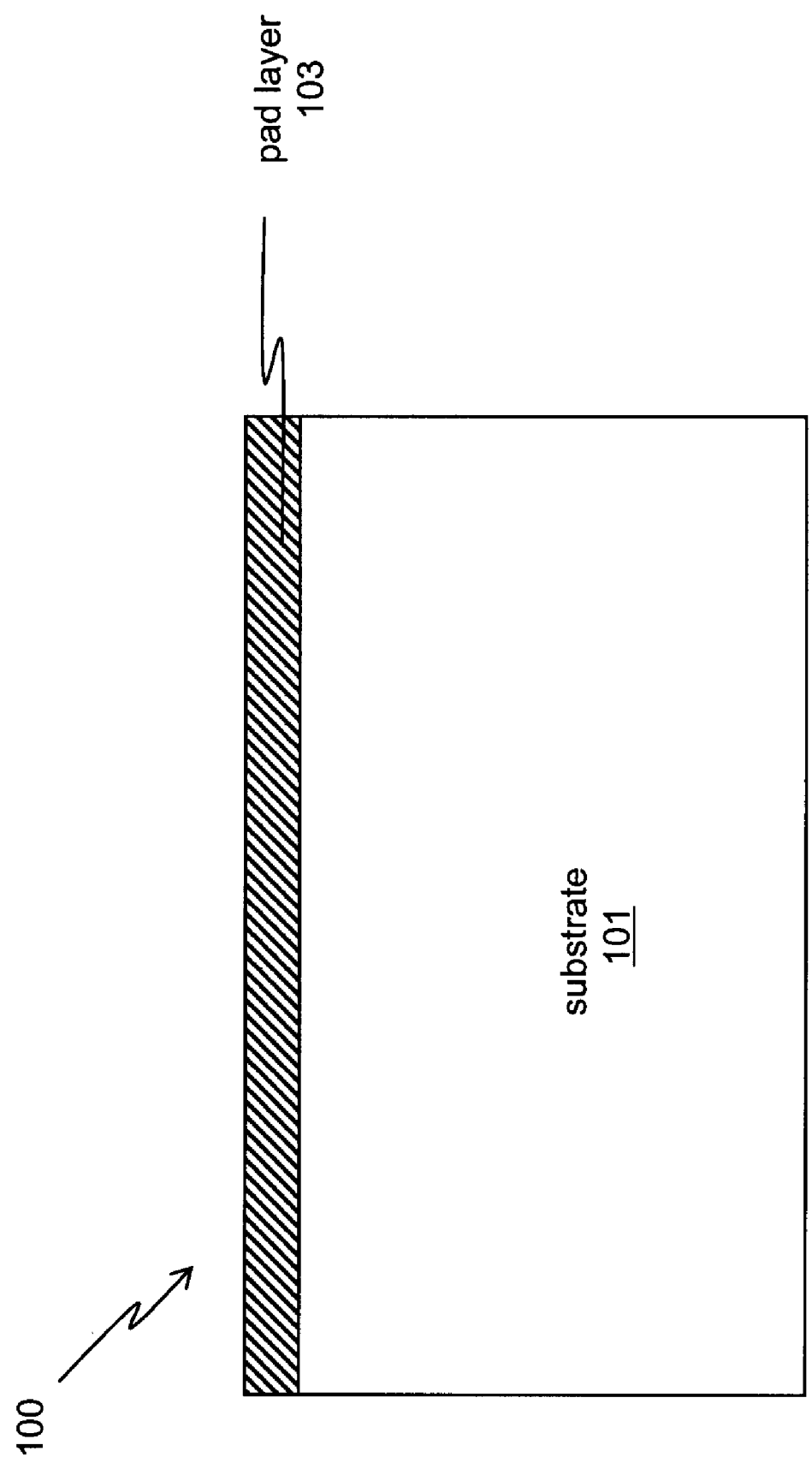
FIGS. 1-4 show fabricating steps of manufacturing an electrical device according to a first embodiment of the invention.

Referring now to FIGS. 1-5, there is shown a cross-section of a portion of an electrical device 100. "Electrical device" refers to an electrical, electro-mechanical, semiconductor, digital, or similar device. Illustrative types of electrical devices include, but are not limited to, transistors, capacitors, resistors, logic devices, memory devices, computer processors, traces, vias, semi-conductor wafer, computer chip, application specific integrated circuit (ASIC), system-on-chip (SoC), and the like. As shown in FIG. 1, the electrical device 100 includes a substrate 101 covered with a pad layer 103.

The substrate 101 is formed of any suitable material, for example, silicon (Si). Other suitable alternative types of substrates include germanium (Ge), silicon germanium (SiGe), silicon carbide (SiC), and those consisting essentially of one or more compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Alternatively, the substrate has a semiconductor-on-insulator type structure, e.g., a silicon-on-insulator (SOI) substrate. In one embodiment, the thickness of the substrate approximates that of a standard semiconductor wafer known in the art.

The pad layer 103 acts to prevent the layers which are directly beneath it from being removed by any of the subsequent processes. By selectively patterning openings in the pad layer, recesses can be formed through all or portions of the underlying substrate layers, as discussed below. Additionally, use of the pad layer permits the epitaxial growth (and deposition) of specific materials such as Si, Ge, SiGe, SiC, those consisting essentially of one or more compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity), and those having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Each of these exemplary materials may be applied to all embodiments described herein.

The material forming the pad layer 103 will vary depending on the type of manufacturing process used. Exemplary pad layer materials include, but are not limited to, silicon nitride and/or silicon oxide. Persons skilled in the art, however, will readily understand additional types of materials that can be used to form the pad layer. Illustratively, the pad layer has an overall thickness of about 0.2 microns when it is desired to form a recess that is approximately 2.0 micron deep. This exemplary thickness may be applied to all embodiments herein described.

Figure 2:
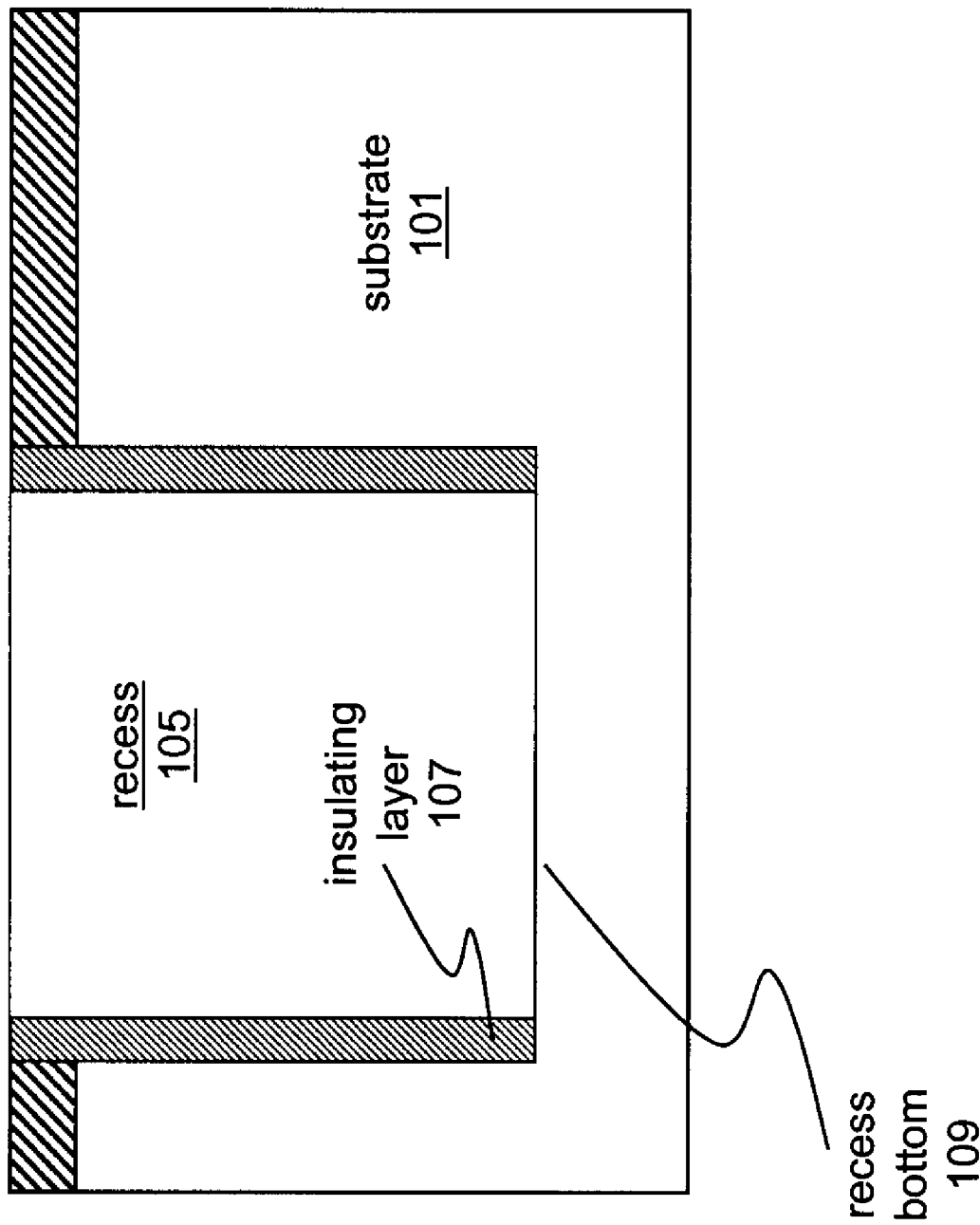

In FIG. 2, the substrate 101 is shown having a recess 105 formed therein formed using reactive ion etching or dry etching processes. The exact width of recess 105 is not critical, but the depth is formed in the range of about 1.0 micron to about 3.0 microns deep. An exemplary width is about 100 microns. These illustrative recess measurements may be applied to all embodiments disclosed herein. Thereafter, an insulating layer 107 formed of an oxide or nitride material is conformally deposited on the sidewalls and bottom 109 of the recess 105 using any suitable deposition or growth process known in the art. Illustratively, the insulating layer is formed to be in the range of approximately 10 Angstroms to about 100 Angstroms thick. This exemplary measurement may be applied to all embodiments described herein. After the insulating layer 107 is formed, lateral, but not vertical, portions thereof are removed from the recess using anisotropic etching such as reactive ion etching (RIE). That is, the portion of the insulating layer 107 formed on the recess bottom 109 is removed; however the insulating layer formed on the recess sidewalls remains thereon. The end result is that the recess bottom 109 is exposed while the recess sidewalls are conformally coated with the insulating layer 107. In this illustrative embodiment, the insulating layer 107 is also formed on the interior exposed edges of the pad layer, as shown.

Figure 3:
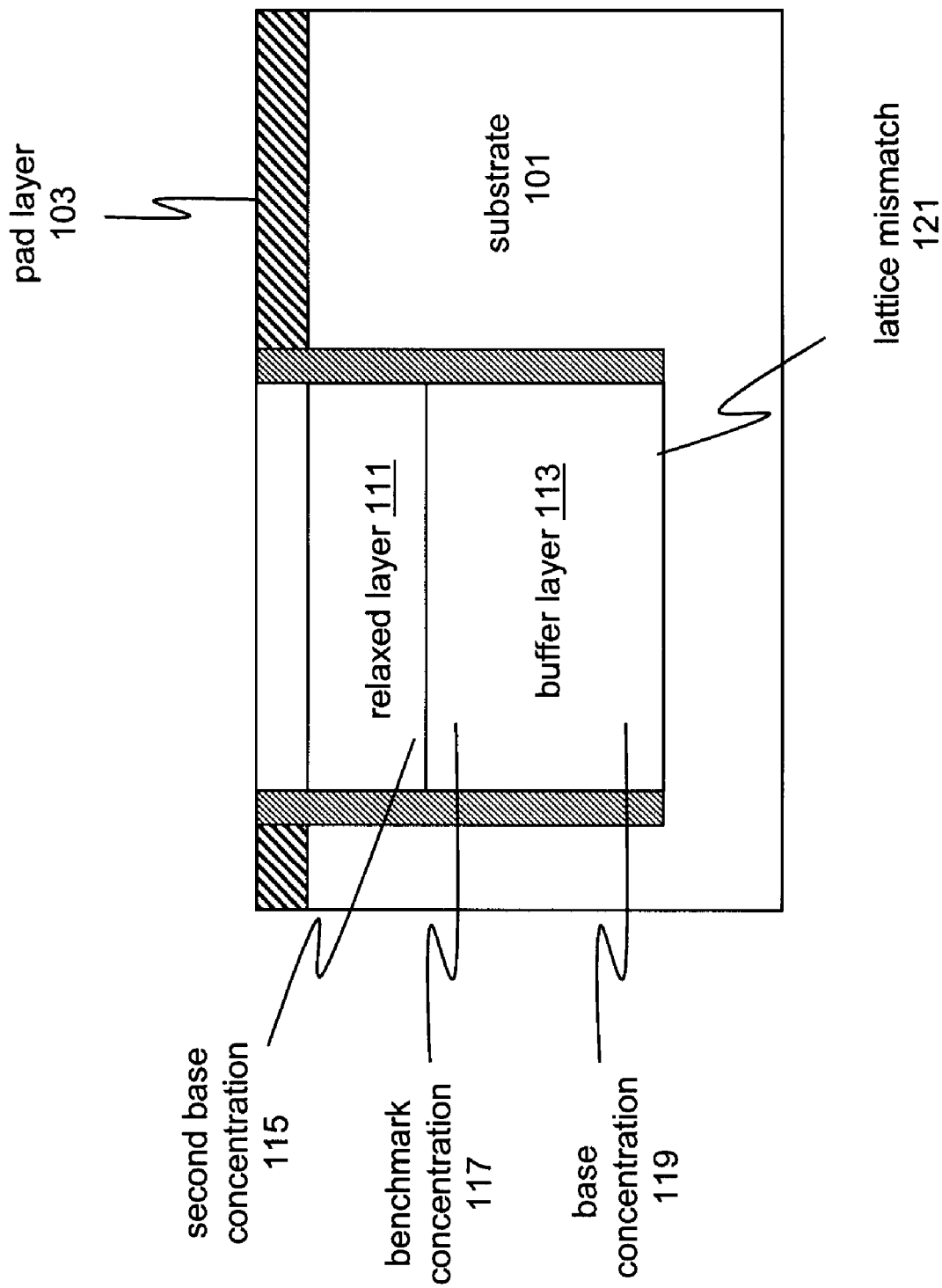

In FIG. 3, a buffer layer 113 forms a lattice constant/structure mismatch 121 with the substrate 101 and functions to constrain most of the dislocations caused by the mismatch. Illustratively, the buffer layer may have an overall thickness from less than about 0.5 microns to more than about 2.0 microns. A relaxed layer 111 is formed on the buffer layer and remains relatively defect free. Illustratively, the overall thickness of the relaxed layer 111 may be about 0.2 microns. These exemplary thickness measurements may be applied to all the embodiments described herein.

The buffer layer 113 and the relaxed layer 111 are epitaxially grown in the recess 105, within the confines of the insulating layer 107. Buffer layer 113 is formed first, then the relaxed layer 111. The buffer layer 113 growth process starts from the recess bottom 109 and works upwards, layer after layer, until an overall thickness of approximately 0.5 micron to approximately 2.0 micron is reached. In one embodiment, silicon germanium (SiGe) is used to form the buffer layer 113 and the relaxed layer 111 in order to subsequently form a semiconductor layer such as silicon atop of the relaxed layer 111 with a tensile stress. In an alternative embodiment, silicon carbon (SiC) may be used to provide a compressive strain in the subsequently formed silicon layer.

The buffer layer 113 and the relaxed layer 111 may be deposited or grown using conventional techniques such as chemical vapor deposition methods. For example, ultrahigh vacuum chemical vapor deposition (UHVCVD) may be used in a conventional manner to grow a device quality SiGe or SiC layer. Other conventional techniques include rapid thermal chemical vapor deposition (RTCVD), lowpressure chemical vapor deposition (LPCVD), limited reaction processing CVD (LRPCVD) and molecular beam epitaxy (MBE). Optionally, a thin silicon buffer layer (not shown) may be formed on the interior walls of the recess 105 before SiGeor SiC formation.

The multi-layered buffer layer 113 is constructed in such a fashion that a concentration of a material (Ge, for example) incrementally increases from a base concentration 119 proximate the bottom of the recess to a benchmark concentration 117 proximate a top surface of the buffer layer. This incremental increase in concentration may be in any stepped fashion, such as for example, by 10% for each new deposition or grown layer. However, any percentage increase may be used depending on the desired applications and requested costs. In theory, the concentration of Ge can range from a base concentration of less than about 1% to a benchmark concentration of 100%. However, for cost and other reasons, a benchmark concentration of about 40% may be used. To prevent defects from occurring in the relaxed layer, the second base concentration 115 of a material used to form the relaxed layer 111 (i.e., Ge if SiGe is used) is chosen to approximately match the benchmark concentration 117 of Ge in the buffer layer 113.

Figure 4:
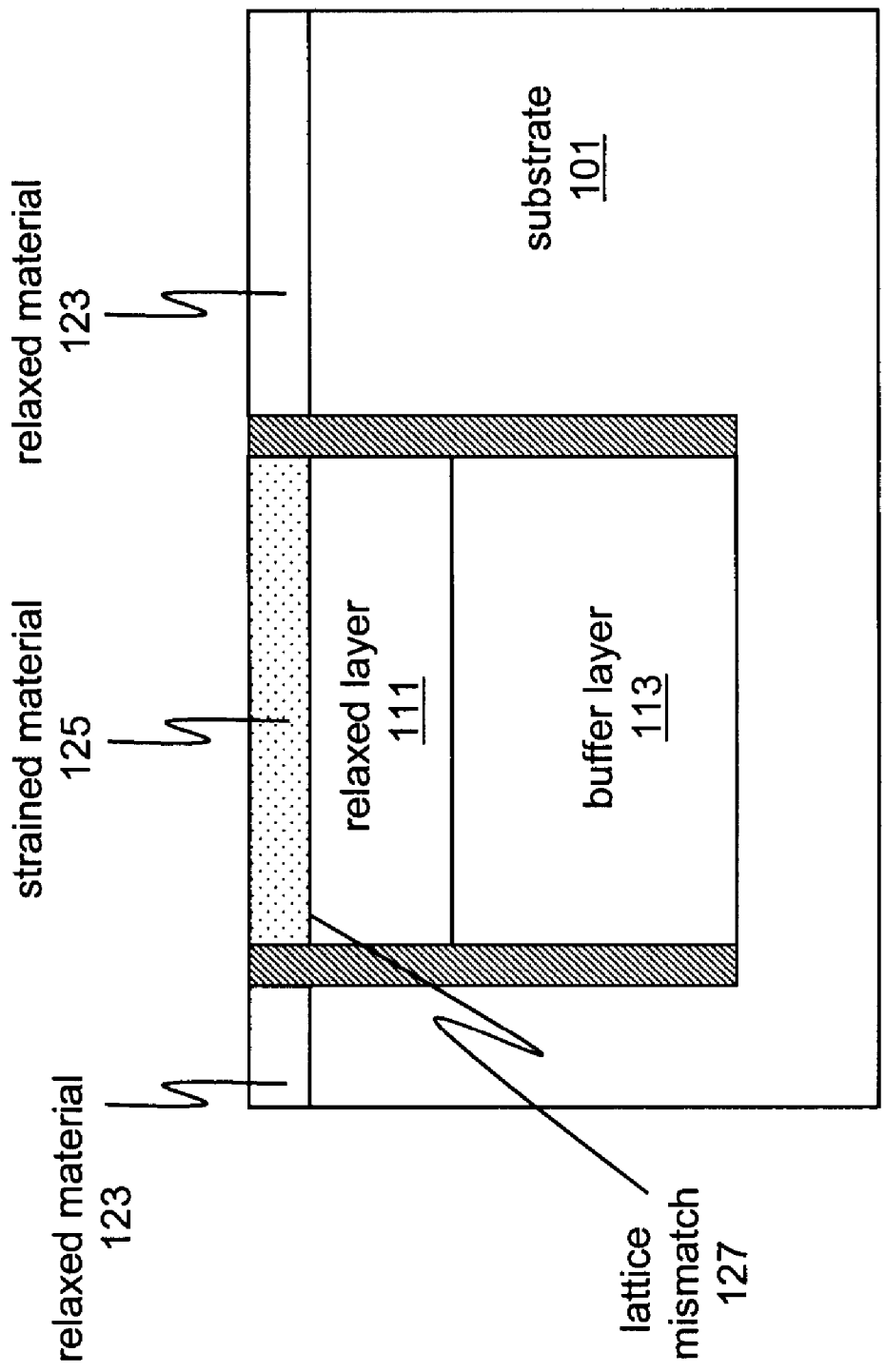

Referring to FIG. 4, the pad layer is removed, and a layer of material (such as, but not limited to, Si) is epitaxially grown within and without the confines of the insulating layer 107 to formed relaxed material 123 and strained material 125. Material 123 is described as relaxed (or non-strained) because its lattice constant approximately equals the lattice constant of the substrate 101. Material 125 is described as strained because its lattice constant differs from the lattice constant of a material used to form the relaxed layer 111. Consequently, a lattice mismatch 127 occurs at the interface between the strained material 125 and the buffer layer 113. Depending on the type of material used to form the relaxed layer 111, strained material 125 may be placed in one of a tensile or a compressive state. Illustratively, strained material 125 is tensily strained when it is formed of Si and the relaxed layer is formed of SiGe. Alternatively, the strained material 125 is compressively strained when it is formed of Si and the relaxed layer 111 is formed of SiC. However, any two different semiconductor materials may be used, because the different lattice structure/constants of each material will exert either a compressive or tensile strain. In one embodiment, the strained material 125 and the relaxed material 123 each have an overall thickness from less than about 20 nanometers to more than about 100 nanometers. These exemplary thicknesses may be used in various embodiments herein described.

Figure 5:
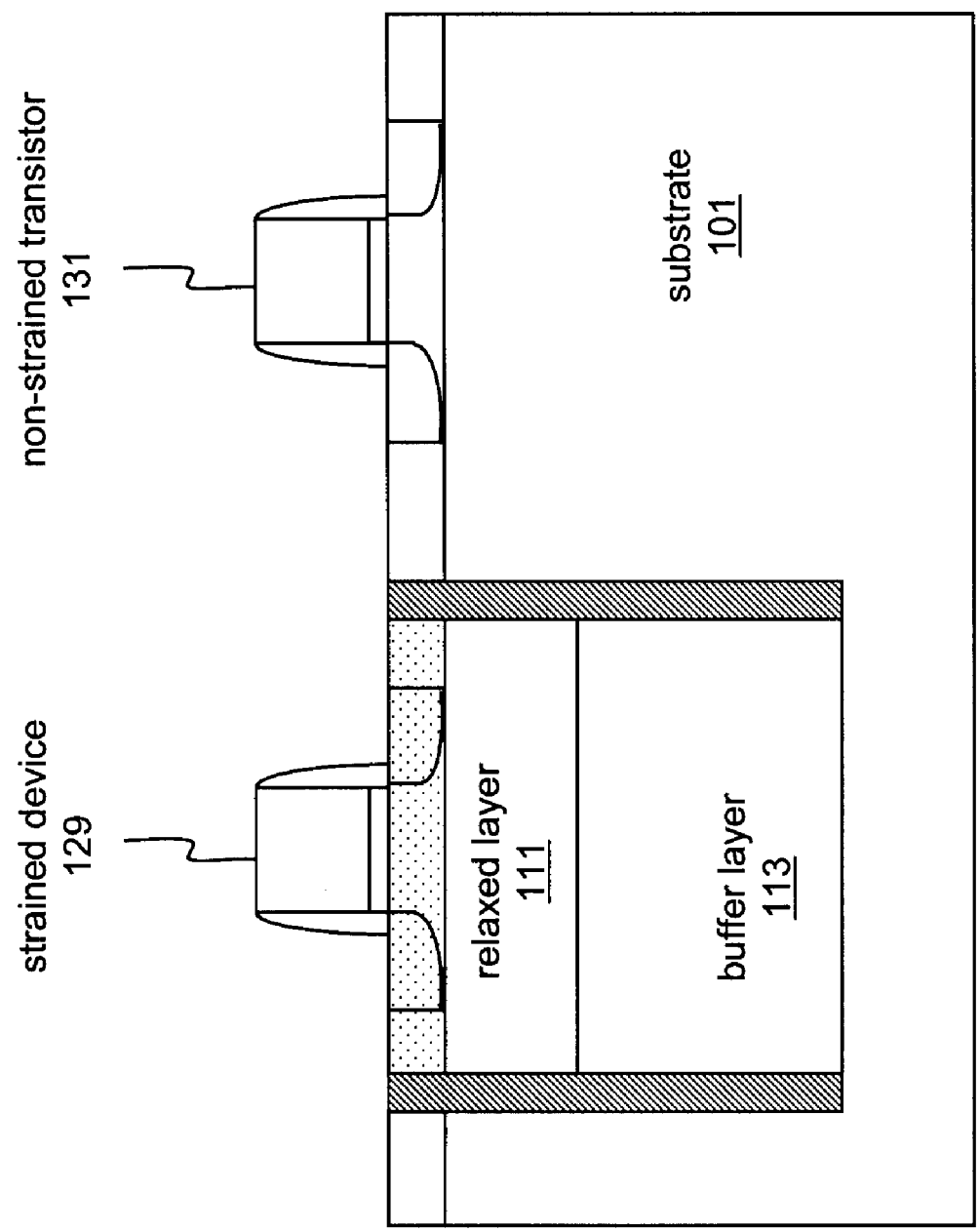
FIG. 5 shows a final structure of an electrical device according to a first embodiment of the invention.

Referring to FIG. 5, a strained device 129 and a non-strained device 131 are formed in the strained material 125 and in relaxed material 123, respectively. Illustratively, strained material 129 is a logic device or a first transistor; and non-strained device 131 is DRAM or a second transistor.

Alternate embodiments and methods of manufacture will now be described with reference to FIGS. 6-11. Because the materials, etching methods, epitaxial growth methods, and deposition methods used to form the embodiments of FIGS. 6-11 are the same as those described above, these figures will be described in less detail in order not to unnecessarily obscure aspects of the invention.

Figure 6:
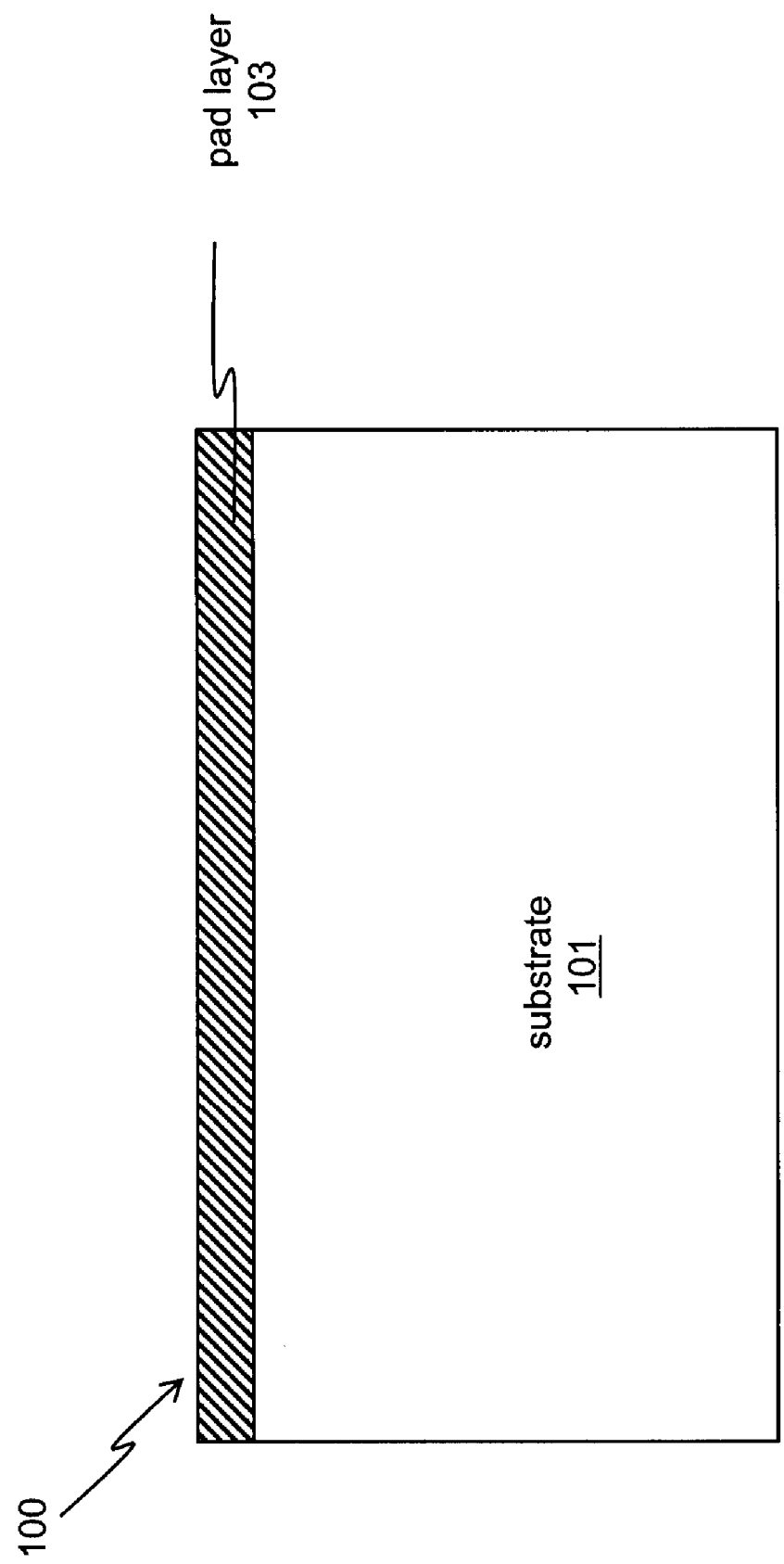
FIGS. 6-10 show fabricating steps of manufacturing an electrical device according to a second embodiment of the invention.
Figure 7:
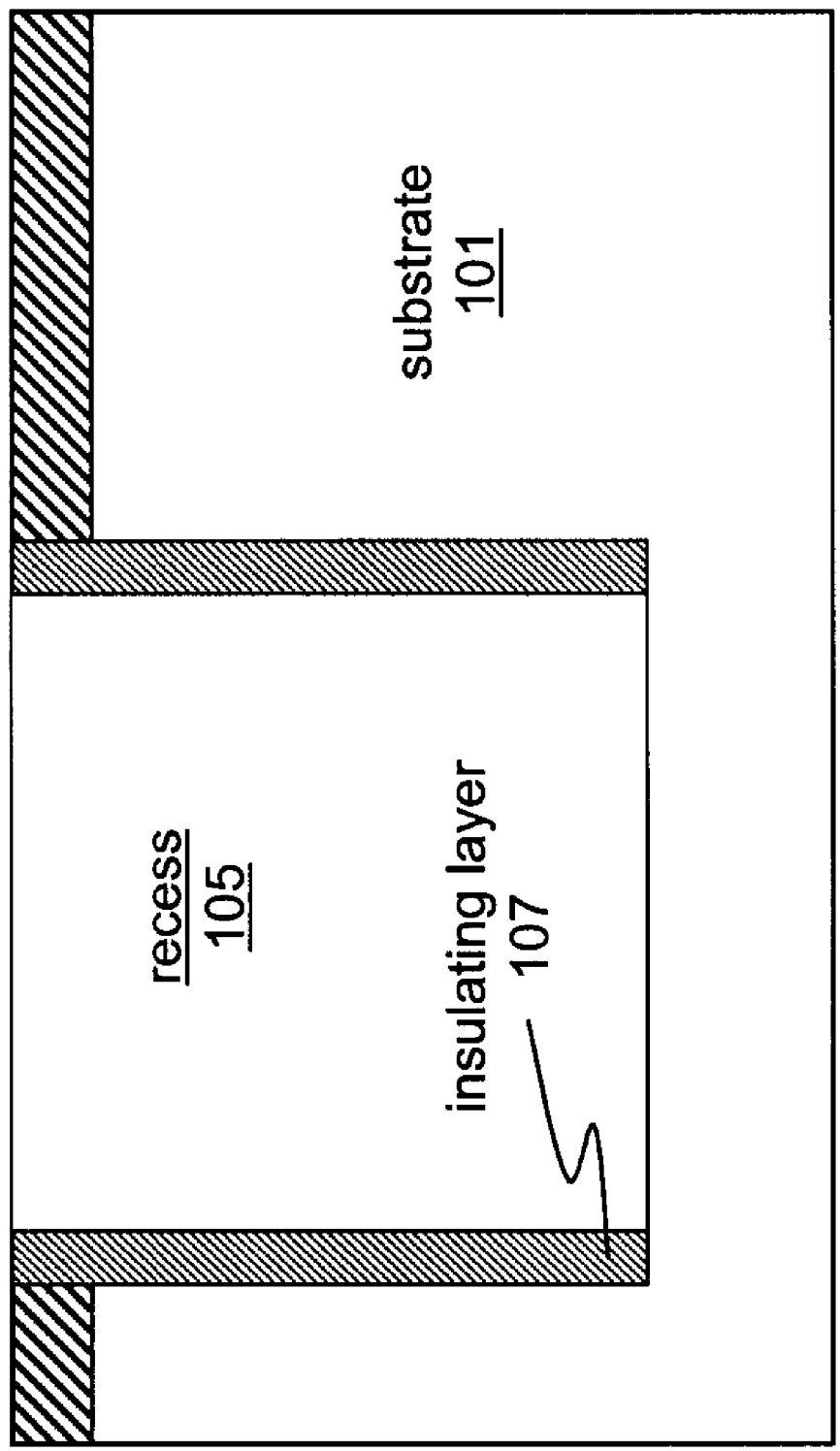

In FIG. 6, a cross-section of an electrical device 100 is shown. The device 100 includes a substrate 101 covered by a pad layer 103. As shown in FIG. 7, a recess 105 is etched through the pad layer 103 and into the substrate 101 to a pre-determined depth, as described above. Thereafter, an oxide or nitride insulating layer 107 is conformally coated on the interior of the recess 105. The bottom portion of the insulating layer 107 is then removed, leaving the portions adhered to the recess sidewalls virtually intact.

Figure 8:
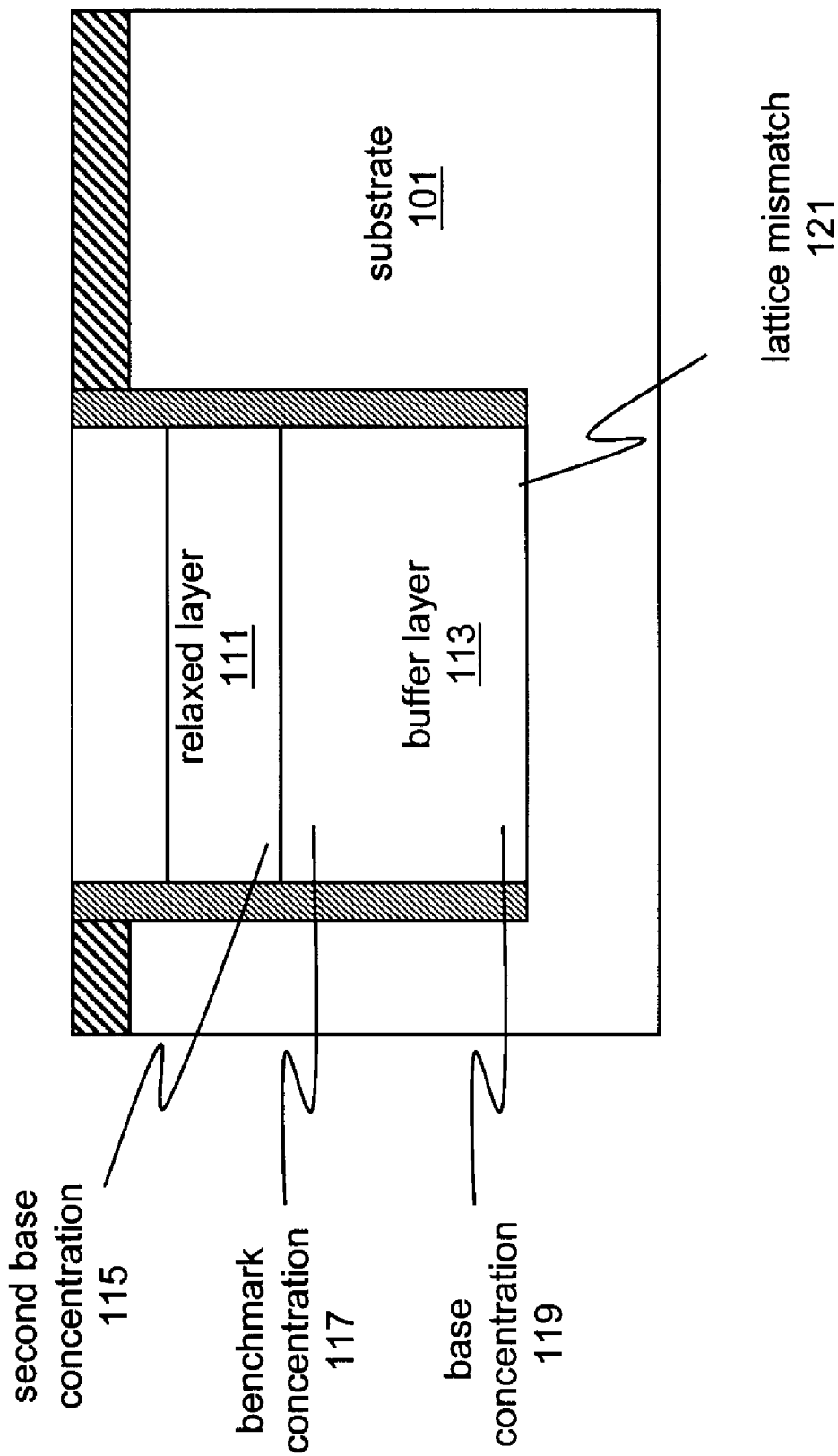
Figure 9:
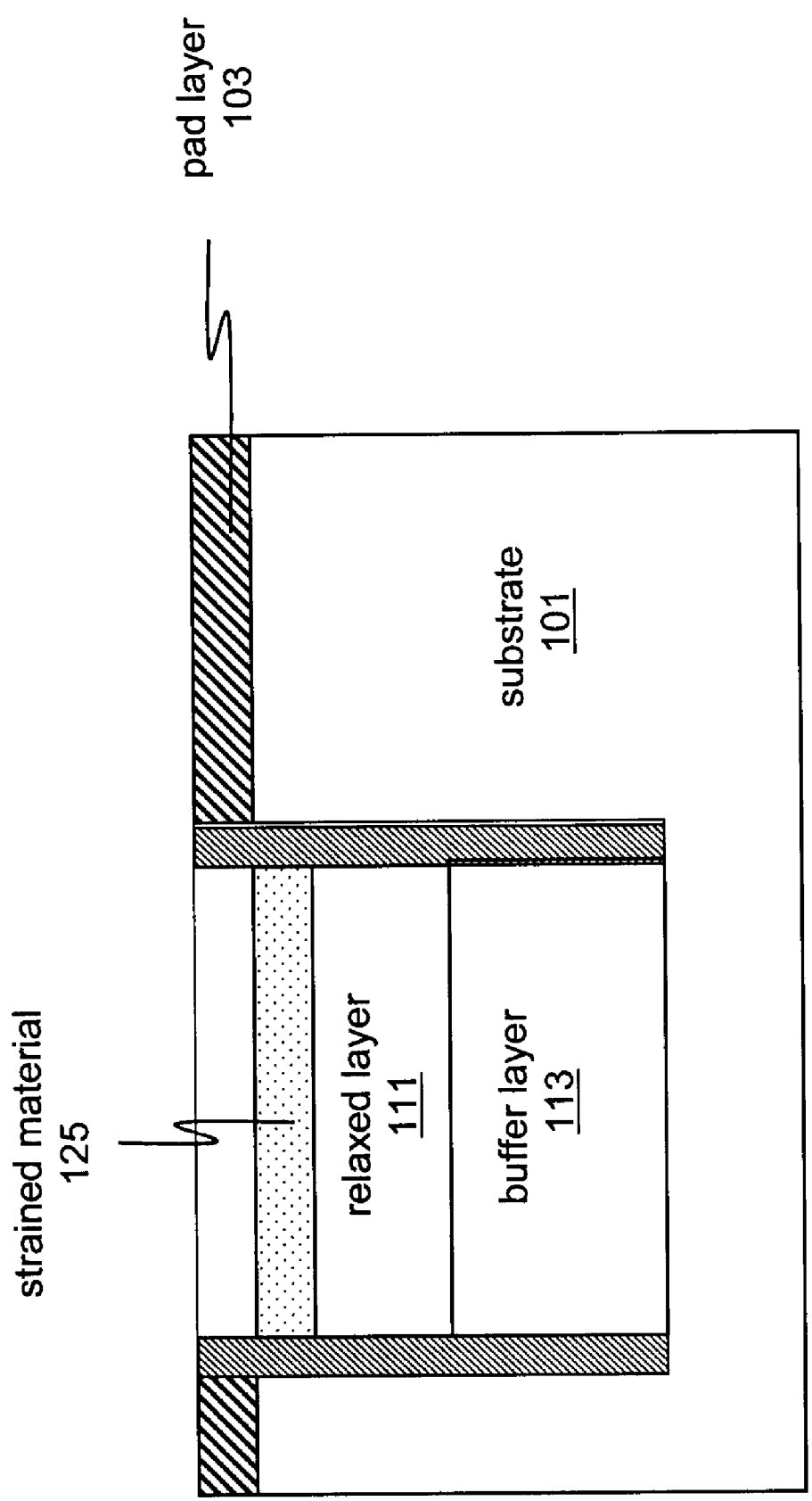

FIG. 8 depicts the formation of the buffer layer 113 and the relaxed layer 111 in the recess 105, within the confines of the insulating layer 107. As mentioned above, a material forming the buffer layer varies in concentration from a base concentration 119 to a benchmark concentration 117. A second base concentration 115 of a material forming the relaxed layer 111 is chosen to approximately match the benchmark concentration 117 of the buffer layer 113. As previously disclosed, the buffer layer 113 functions to contain dislocations caused by the lattice mismatch 121. FIG. 9 illustrates the discrete and selective formation of a strained material 125 in the recess 105, within the confines of the insulating layer 107, and on top of the relaxed layer 111. As previously disclosed, the type of material used to form the relaxed layer 111 determines whether a tensile or compressive force is applied to the strained material 125.

Figure 10:
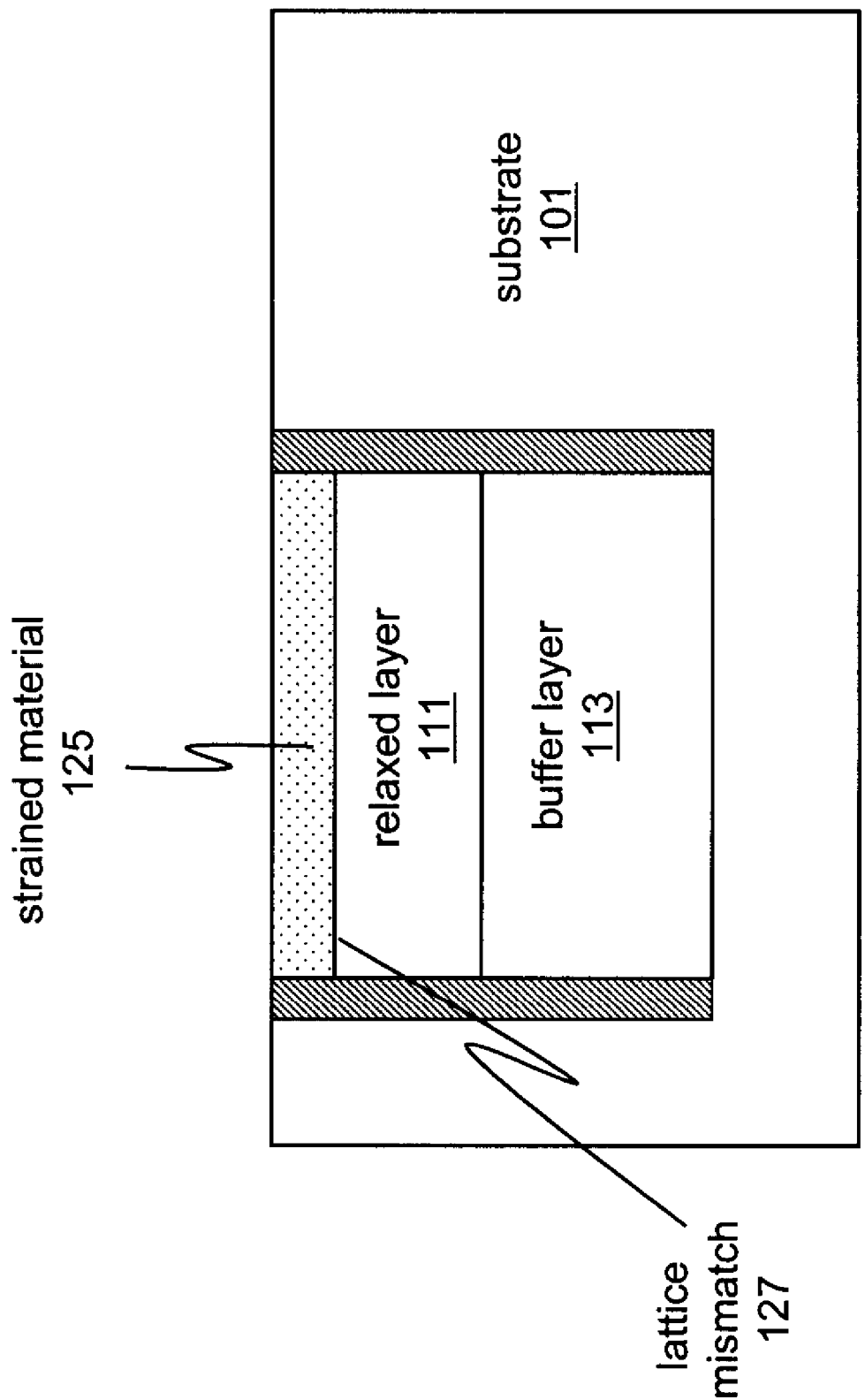

FIG. 10 depicts removal of the pad layer 103 and subsequent planarization of the substrate 101. This Figure also illustrates the lattice mismatch 127 between the strained material 125 and the relaxed layer 111. The type of process used to remove the pad layer depends on the type of material used to form such layers. For example, if silicon nitride is used as the pad layer, then a wet etch using hot phosphoric ($H_3PO_4$) may be used. The type of planarization method used may be any suitable planarization technique. For example, in one embodiment, chemical mechanical polishing (CMP) may be used. In another embodiment, a high temperature reflow process with the presence of hydrogen may be used.

Figure 11:
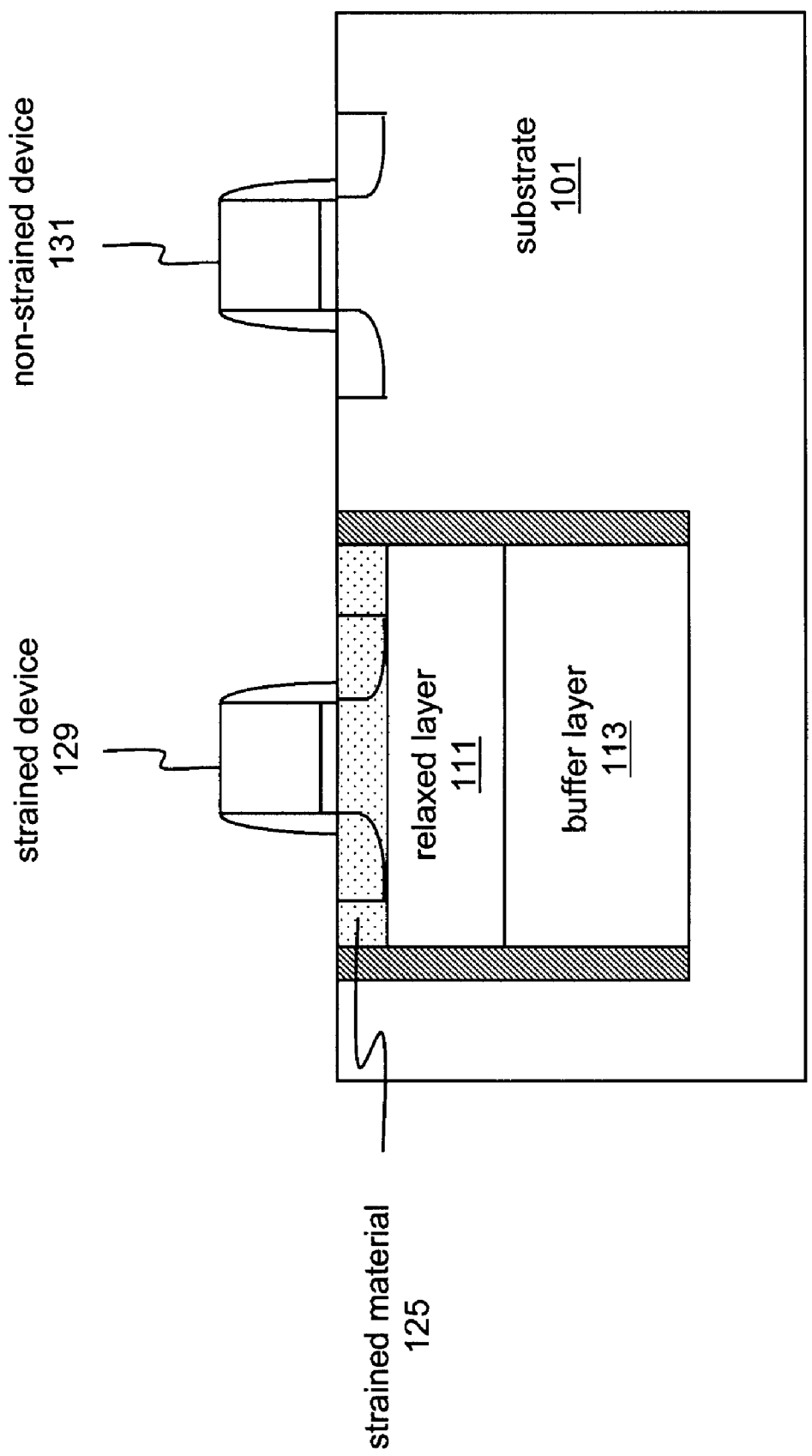
FIG. 11 shows a final structure of an electrical device according to a second embodiment of the invention.

FIG. 11 shows the formation of electrical devices 129 and 131 in the strained material 125 and in the non-strained regions of the substrate 101. In this embodiment, portions of the substrate 101 that are outside the confines of the insulating layer 107 form the relaxed material 123 shown in FIG. 4. As previously described, strained device 129 may illustratively be, but is not limited to, a logic device or a first transistor; non-strained device 131 may illustratively be, but is not limited to, a DRAM or a second transistor.

Figure 12:
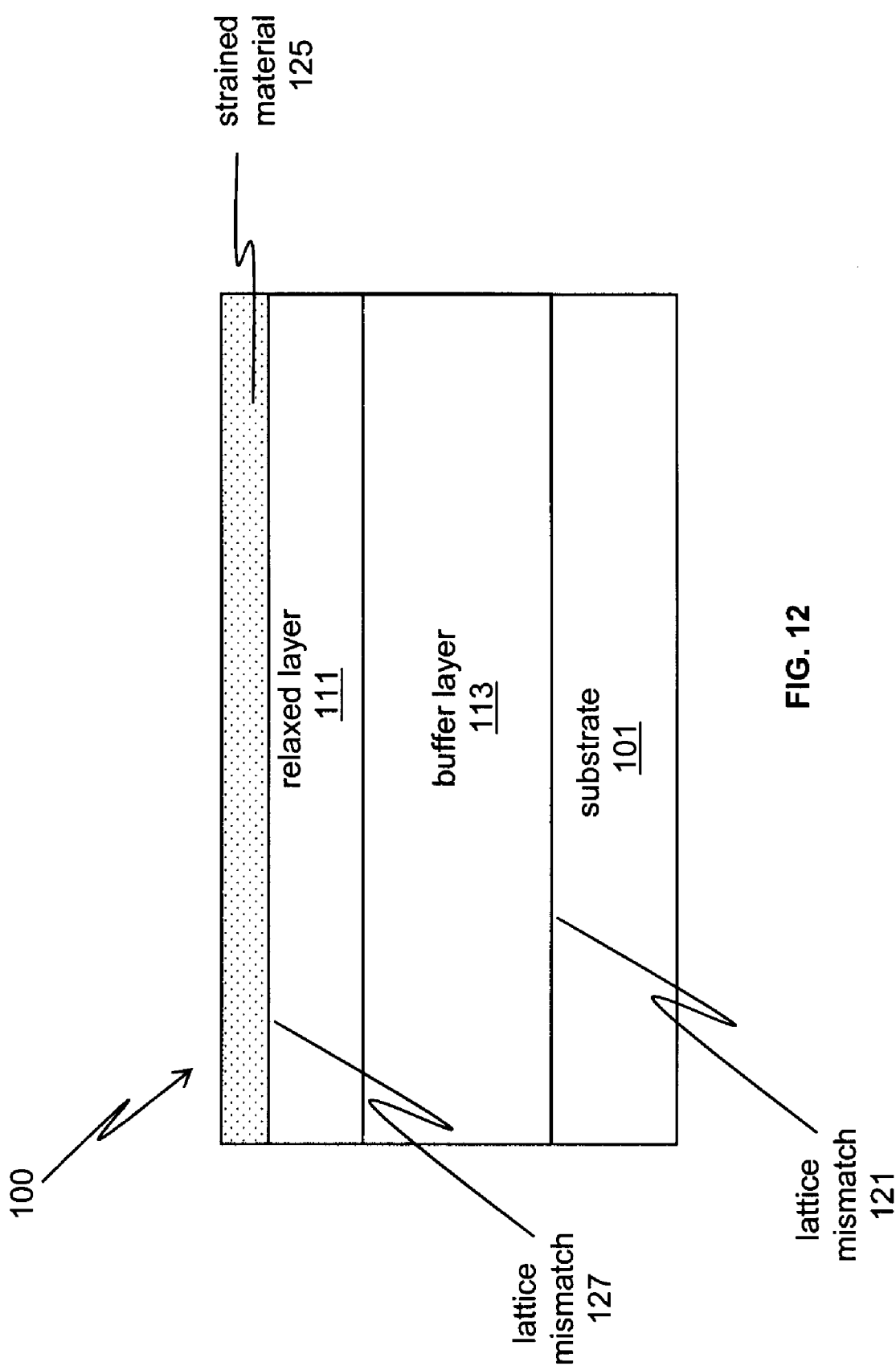
FIGS. 12-15 show fabricating steps of manufacturing an electrical device according to a third embodiment of the invention.
Figure 16:
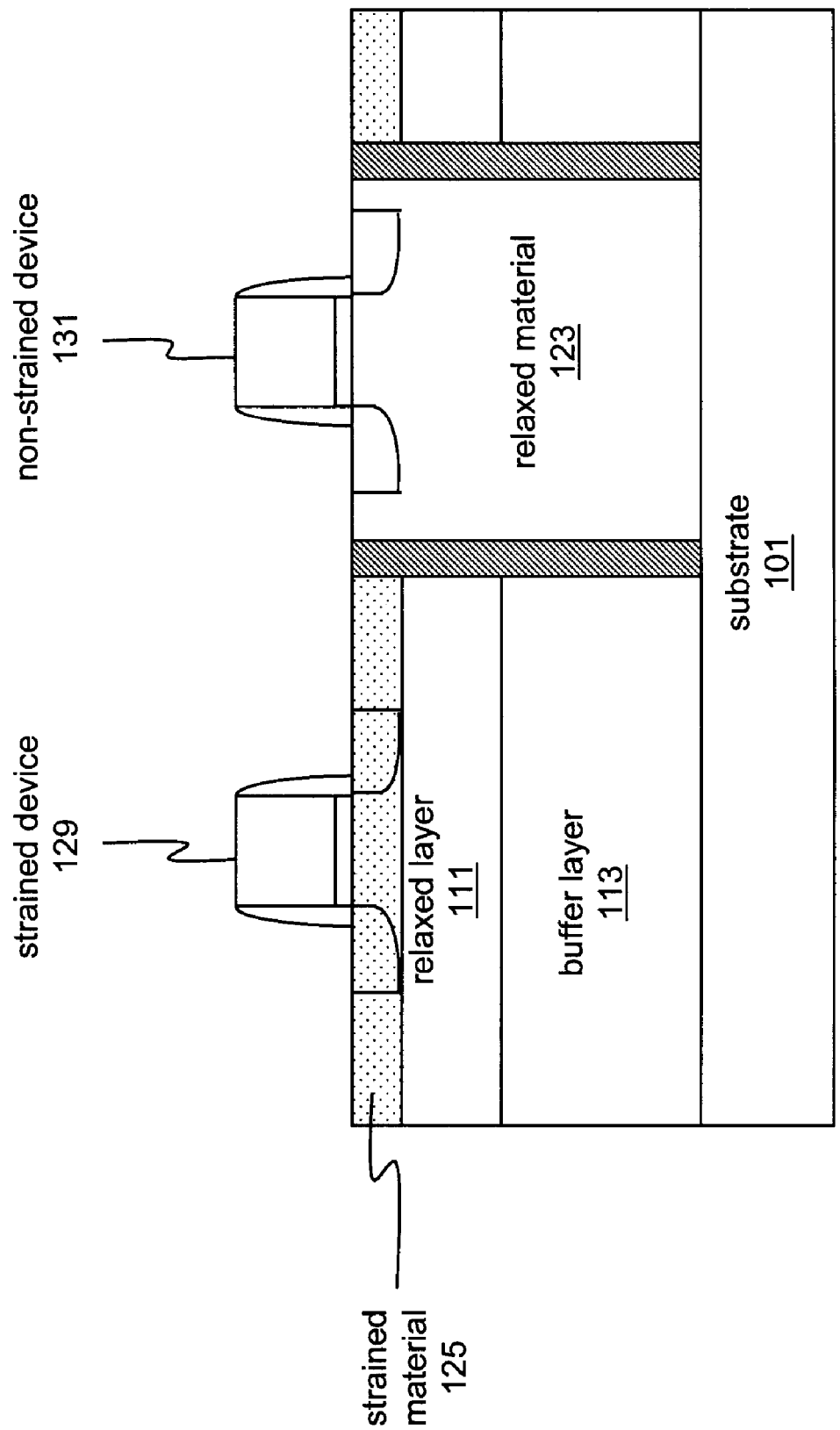
FIG. 16 shows a final structure of an electrical device according to a third embodiment of the invention.

A third embodiment is shown with respect to FIGS. 12 16. FIG. 12 illustrates a cross-sectional view of an electrical device 100 (i.e., a silicon wafer), which includes a substrate 101 on which are formed, in ascending order, buffer layer 113, relaxed layer 111, and strained material 125. This Figure also illustrates the lattice mismatch 121 formed between the substrate 101 and a lower surface of the buffer layer 113, and the lattice mismatch 127 formed between the relaxed layer 111 and the strained material 125. These layers can be grown or deposited in any known manner, with the buffer layer 113 having, in one embodiment, a higher concentration of material closest to the strained layer and gradually decreasing in concentration. This will eliminate or reduce formation of defects in the end product.

Figure 13:
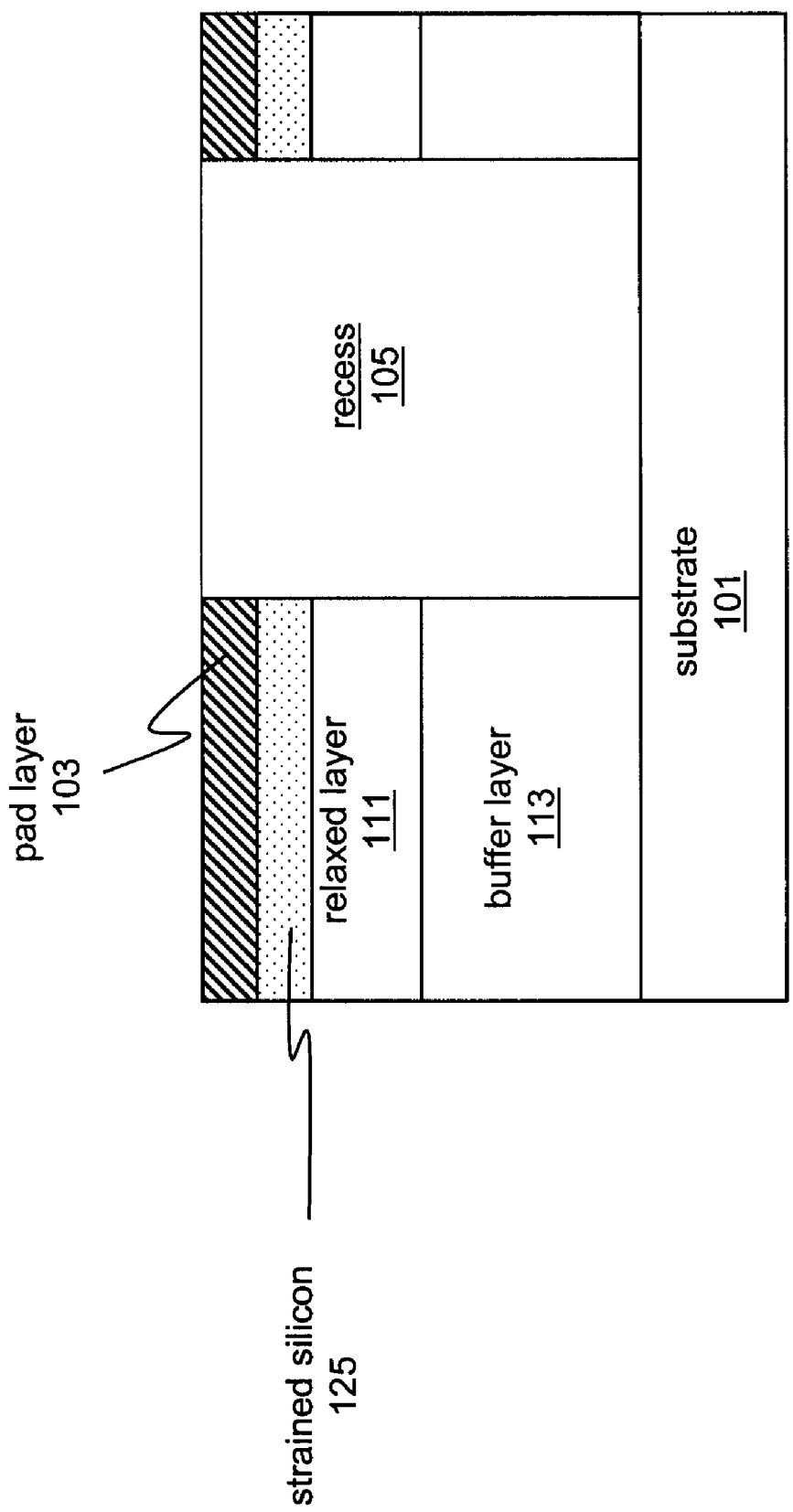

FIG. 13 depicts the formation of a recess 105 that extends through the pad layer 103, the strained material 125, the relaxed layer 111, and the buffer layer 113, but which has as its bottom a portion of the top surface of the substrate 101.

Figure 14:
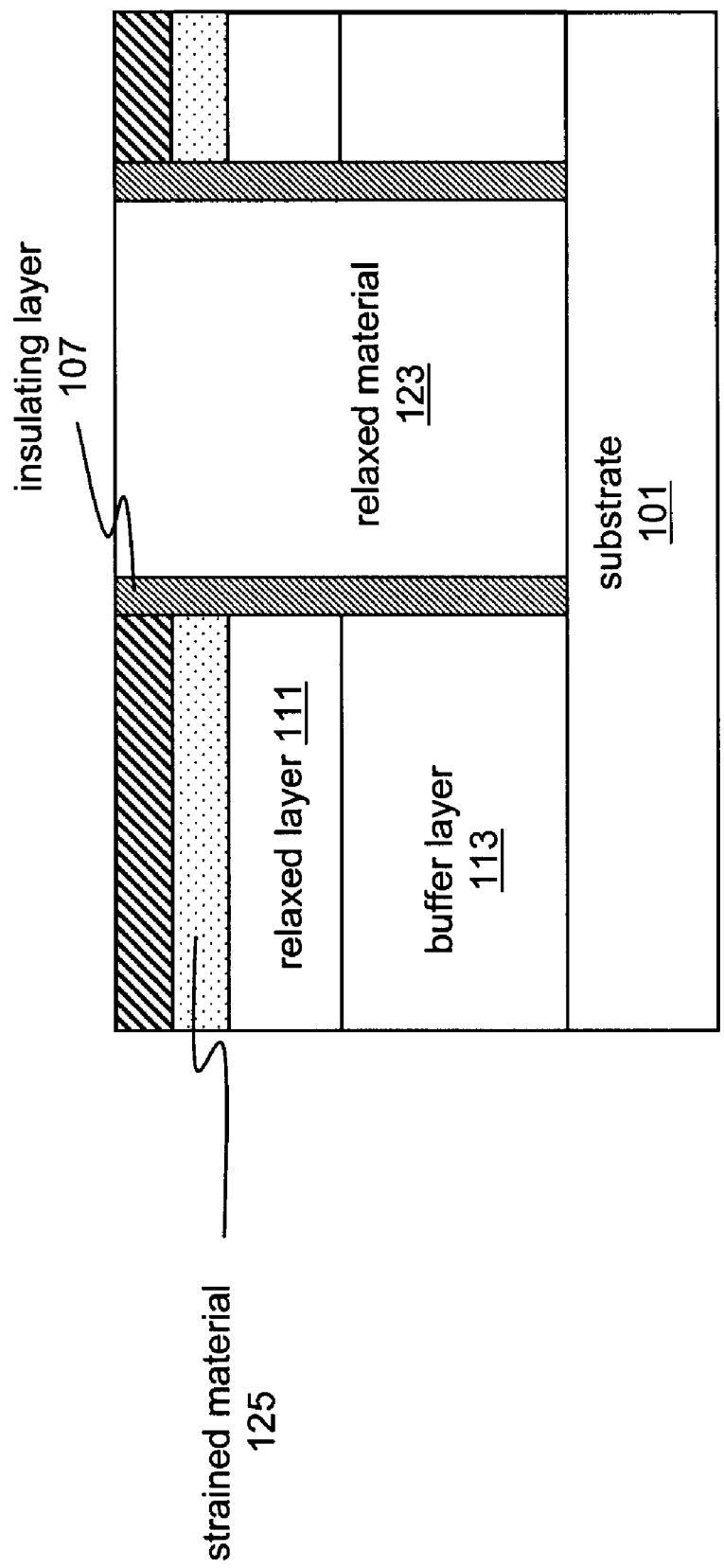
Figure 15:
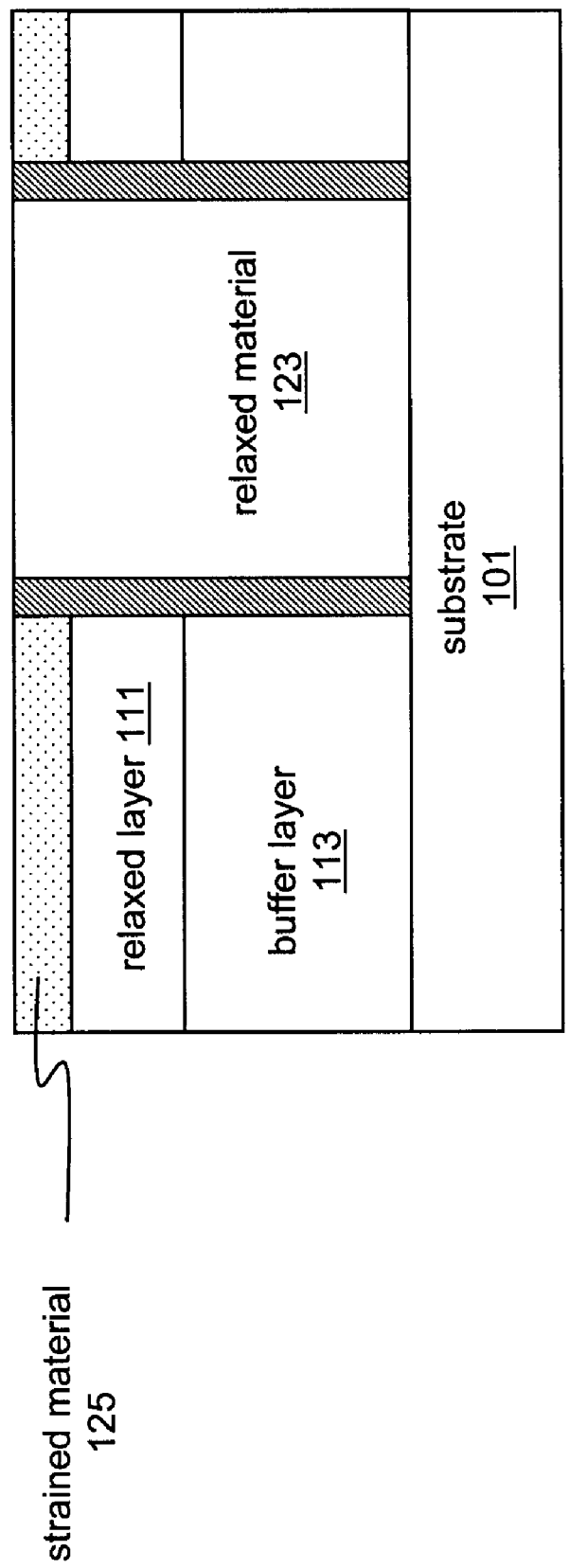

FIG. 14 depicts the formation of insulating layer 107 on the sidewalls of the recess 105. The insulating layer 107 is formed by deposition or growth process followed by an etching process, as previously described. FIG. 15 shows a relaxed material (for example, Si) which is selectively and epitaxially grown in the recess within the confines of the insulating material to completely fill the recess. Thereafter, the pad layer is removed, and the substrate is planarized such that the exposed surfaces of the strained material 125, insulating material, and relaxed material 123 are approximately level. In this embodiment, the strained material 125 is outside, while the relaxed material 123 is within the confines of the insulating material 107. That is, the relaxed material is formed within the recess.

Referring to FIG. 16, there is illustrated the formation of a strained device 129 in the strained material 125 and the formation of a non-strained device 131 in the relaxed material 123. As shown, strained device 129 is located outside the confines of the insulating material, and the non-strained device is located within those confines.

Figure 17:
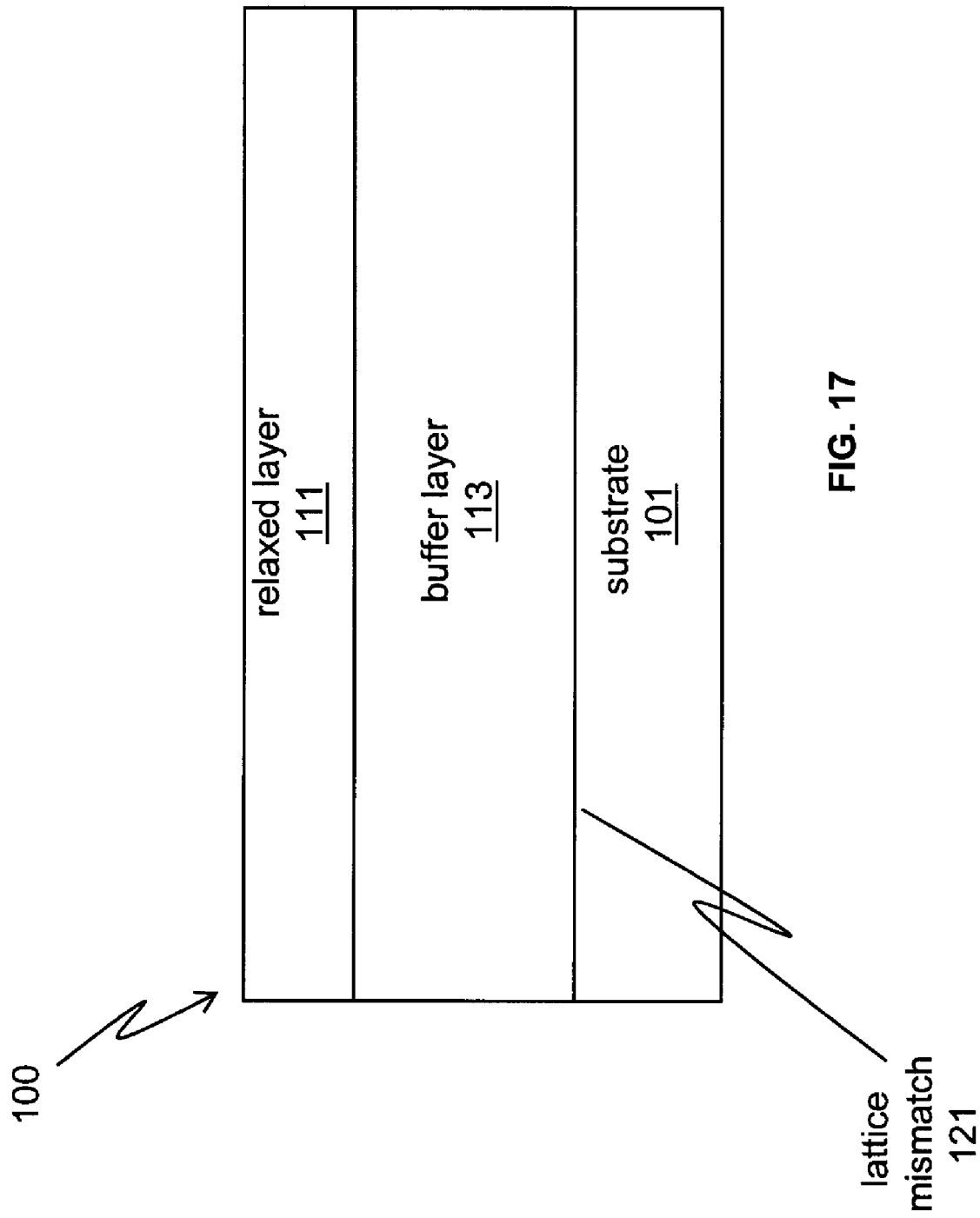
FIGS. 17-21 show fabricating steps of manufacturing an electrical device according to a fourth embodiment of the invention.

A fourth embodiment is shown with respect to FIGS. 17–22. A cross-sectional view of an electrical device 100 in accordance with the fourth embodiment is shown in FIG. 17. The device 100 includes a substrate 101 on which a buffer layer 113 of SiGe is formed. In an alternate embodiment, SiC can also be formed. A relaxed layer 111, also formed of SiGe (or alternatively SiC), covers the top surface of the buffer layer. The lattice mismatch 121 between the buffer layer and the silicon substrate 101 is in the illustrative range of 2% or less. This means that the lattice constant of the lowest SiGe buffer layer differs from the lattice constant of the silicon substrate by about 2% or less. This same percentage may also be applicable for any of the embodiments disclosed herein.

Figure 18:
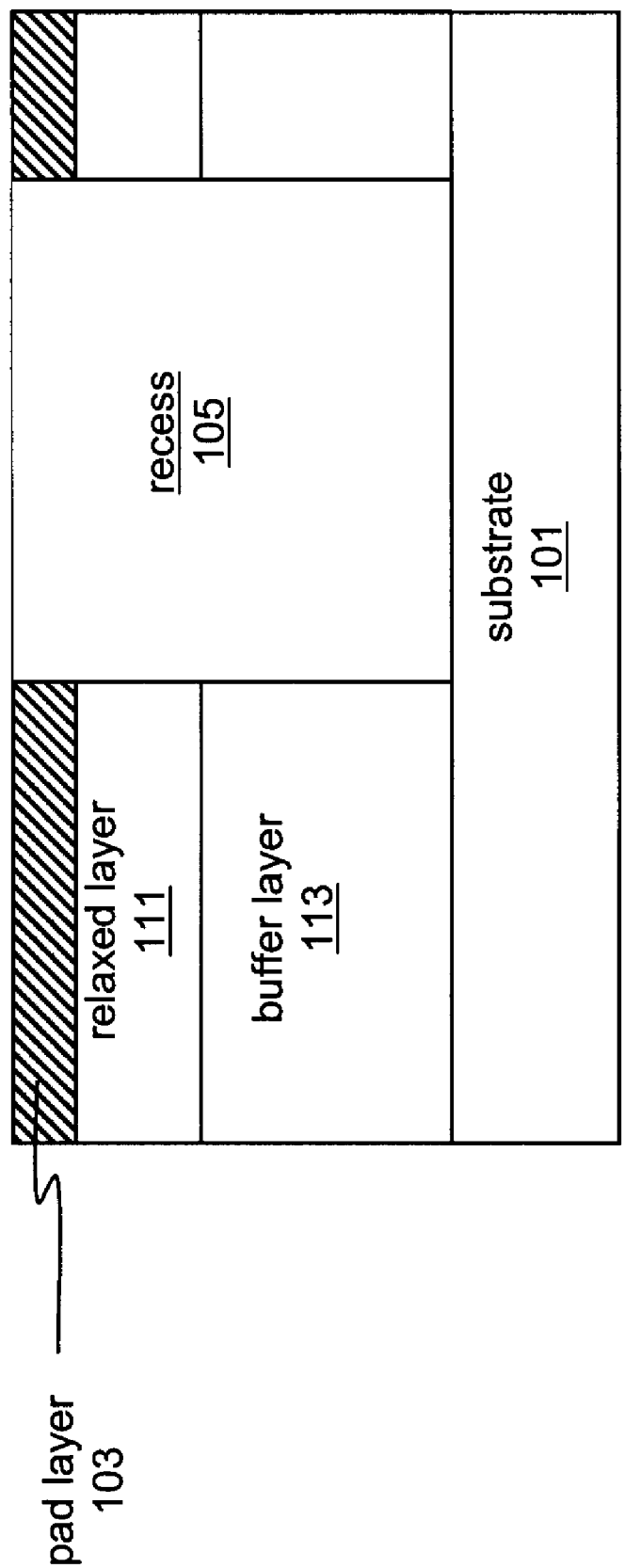
Figure 19:
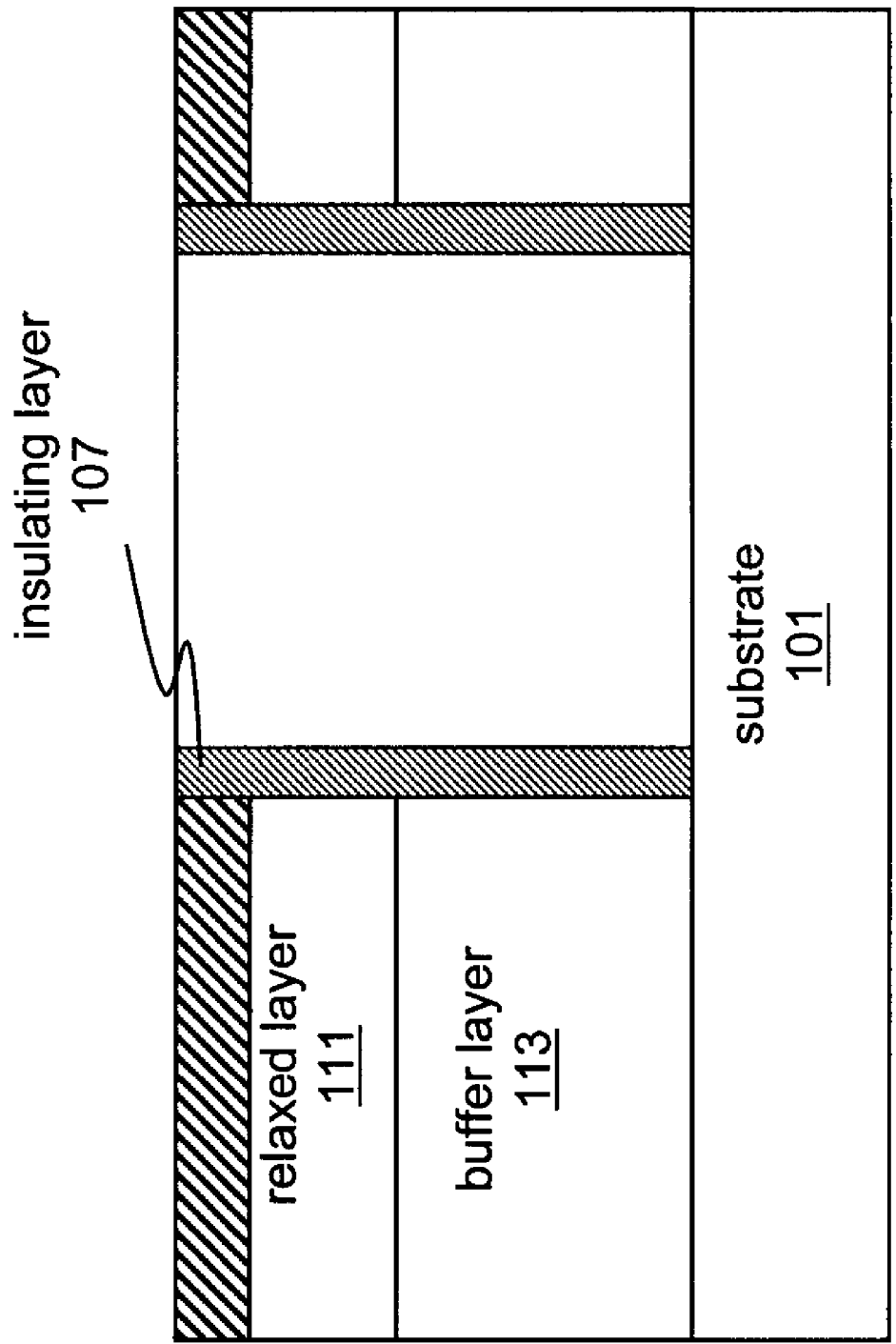
Figure 20:
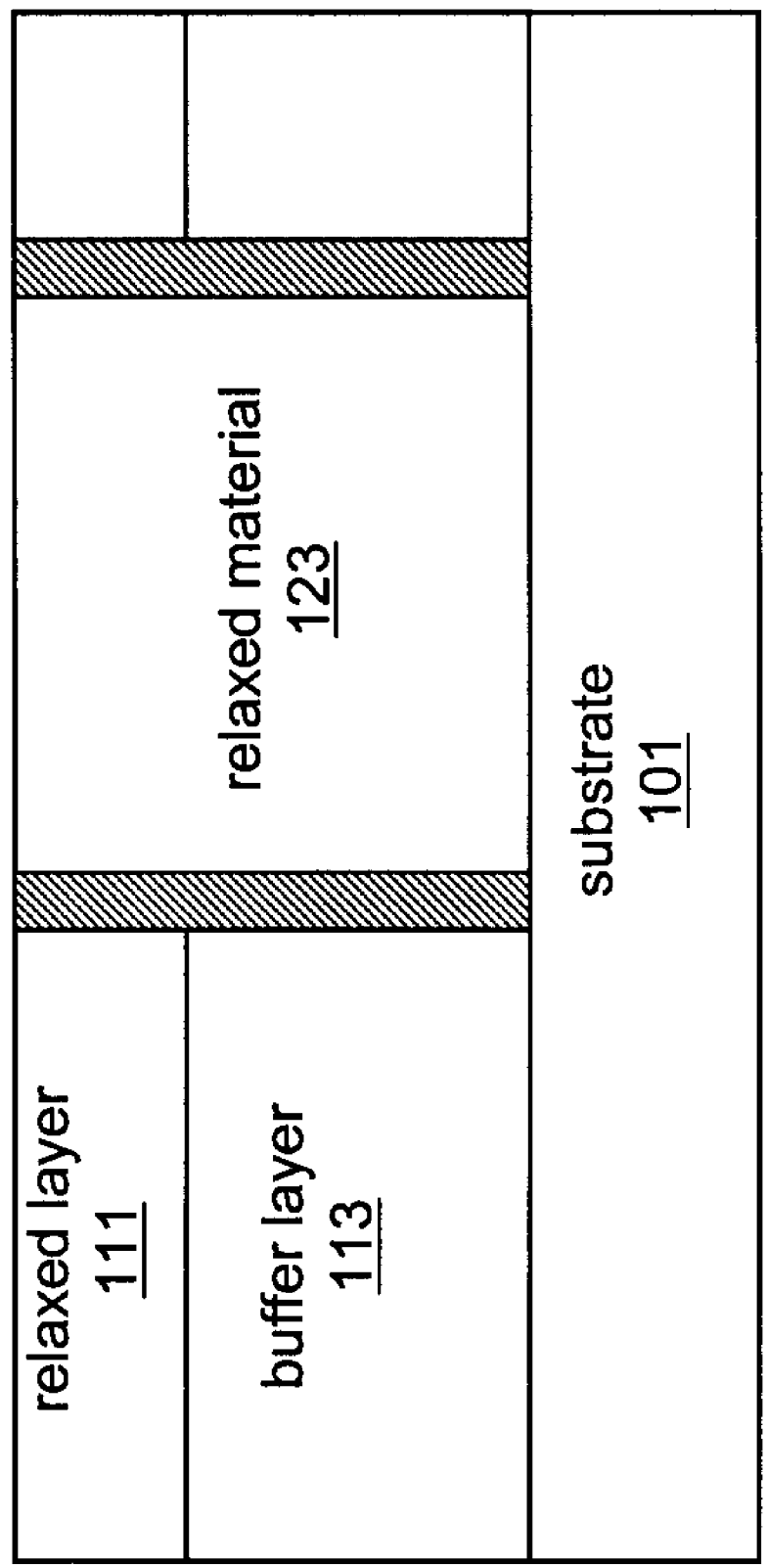
Figure 21:
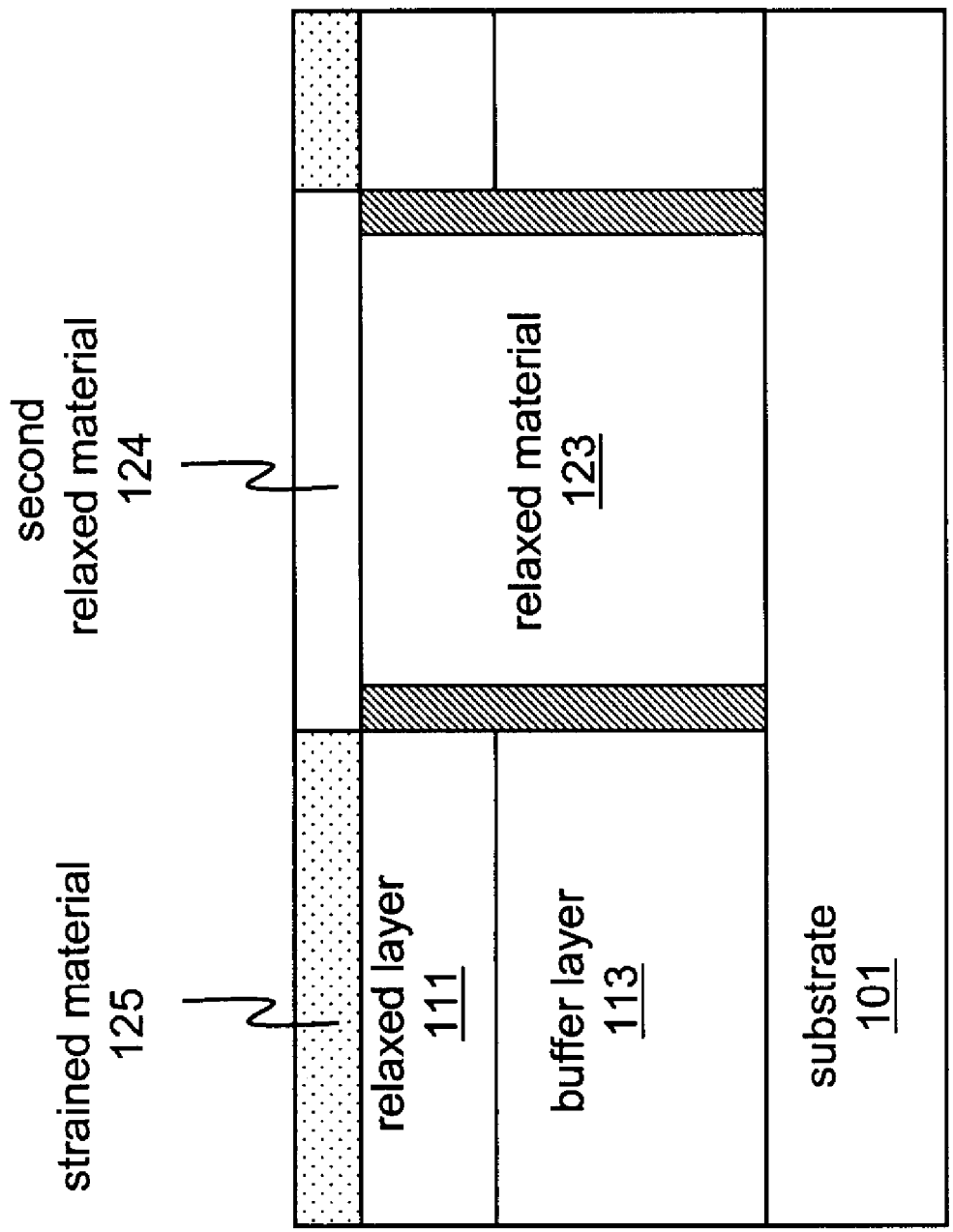

FIG. 18 illustrates the formation of a recess 105 that extends through the pad layer 103, through the relaxed layer 111, and through the buffer layer 113 to expose a top surface of the silicon substrate 101. FIG. 19 depicts the formation of an insulating layer 107 on the sidewalls of the recess 105 and the formation of the relaxed material 123 in the recess, as previously described. In FIG. 20, the pad layer has been removed, and the top surface of relaxed layer 111, insulating layer 107, and relaxed material 123 have been planarized. Thereafter, as shown in FIG. 21, a layer of silicon is epitaxially grown to cover the entire planarized surface.

The result of this process is that the lattice mismatch between the relaxed layer and the silicon layer places a tensile or compressive strain on the silicon, thereby creating strained material 125. Because the lattice mismatch between another portion of the silicon layer and the relaxed material 123 (Si) is negligible, a relaxed (non-strained material) 124 is created within the confines of the recess 105. Although, in this embodiment, the insulating layer 107 does not separate the strained material 125 from the second relaxed material 124, the lateral strain between the strained material 125 and non-strained materials 124 is minimal compared to the strain imposed by the strain imposed by the relaxed layer 111.

Figure 22:
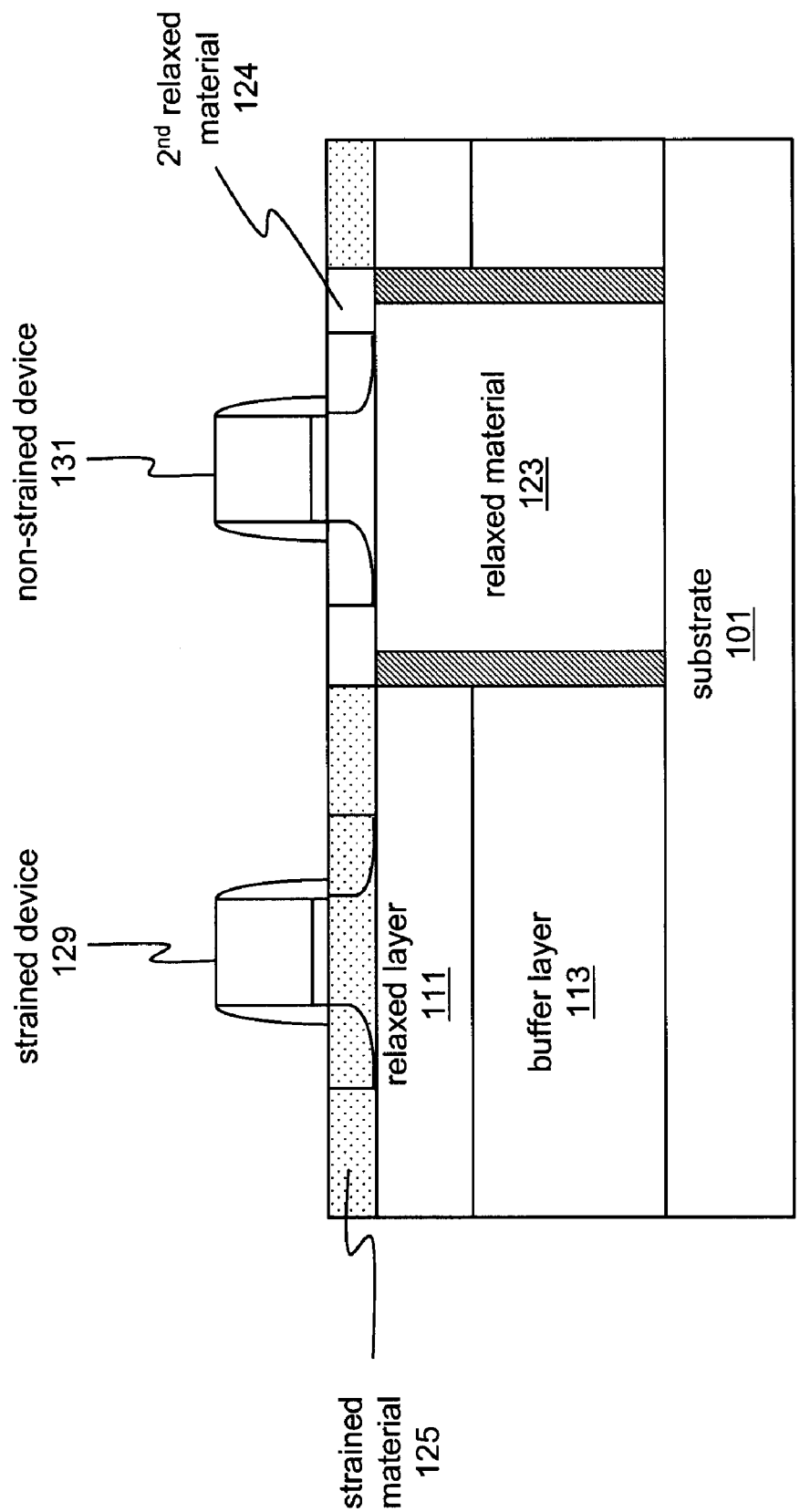
FIG. 22 shows a final structure of an electrical device according to a fourth embodiment of the invention.

FIG. 22 illustrates the formation of a strained device 129 in the strained material 125, and the formation of a non-strained device 131 in the relaxed material 124. As previously disclosed, the strained device 129 may be a logic device, and the non-strained device may be a DRAM. However, other electrical devices, such as transistors and capacitors, may also be used.

Figure 23:
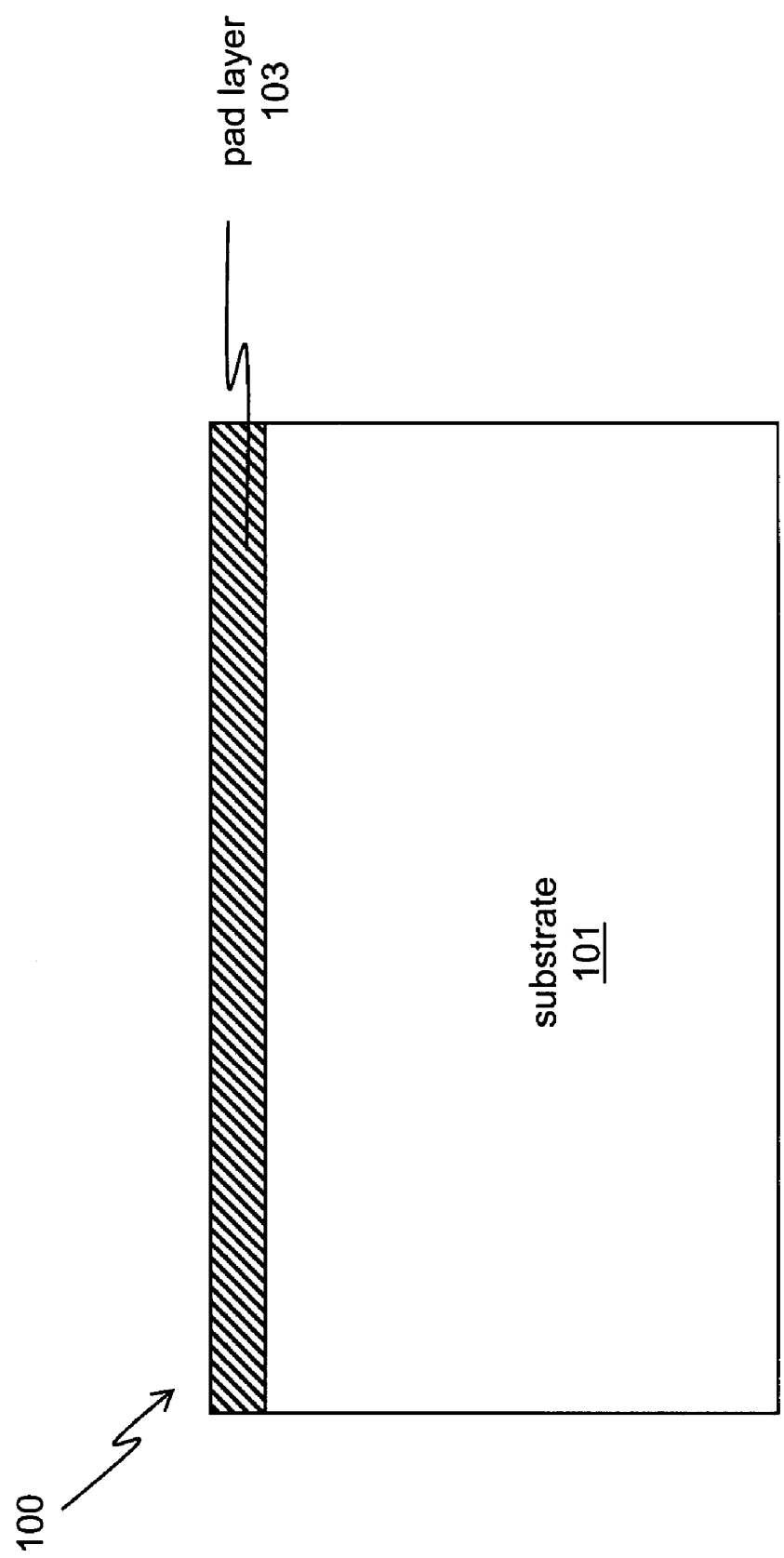
FIGS. 23-26 show fabricating steps of manufacturing an electrical device according to a fifth embodiment of the invention.
Figure 24:
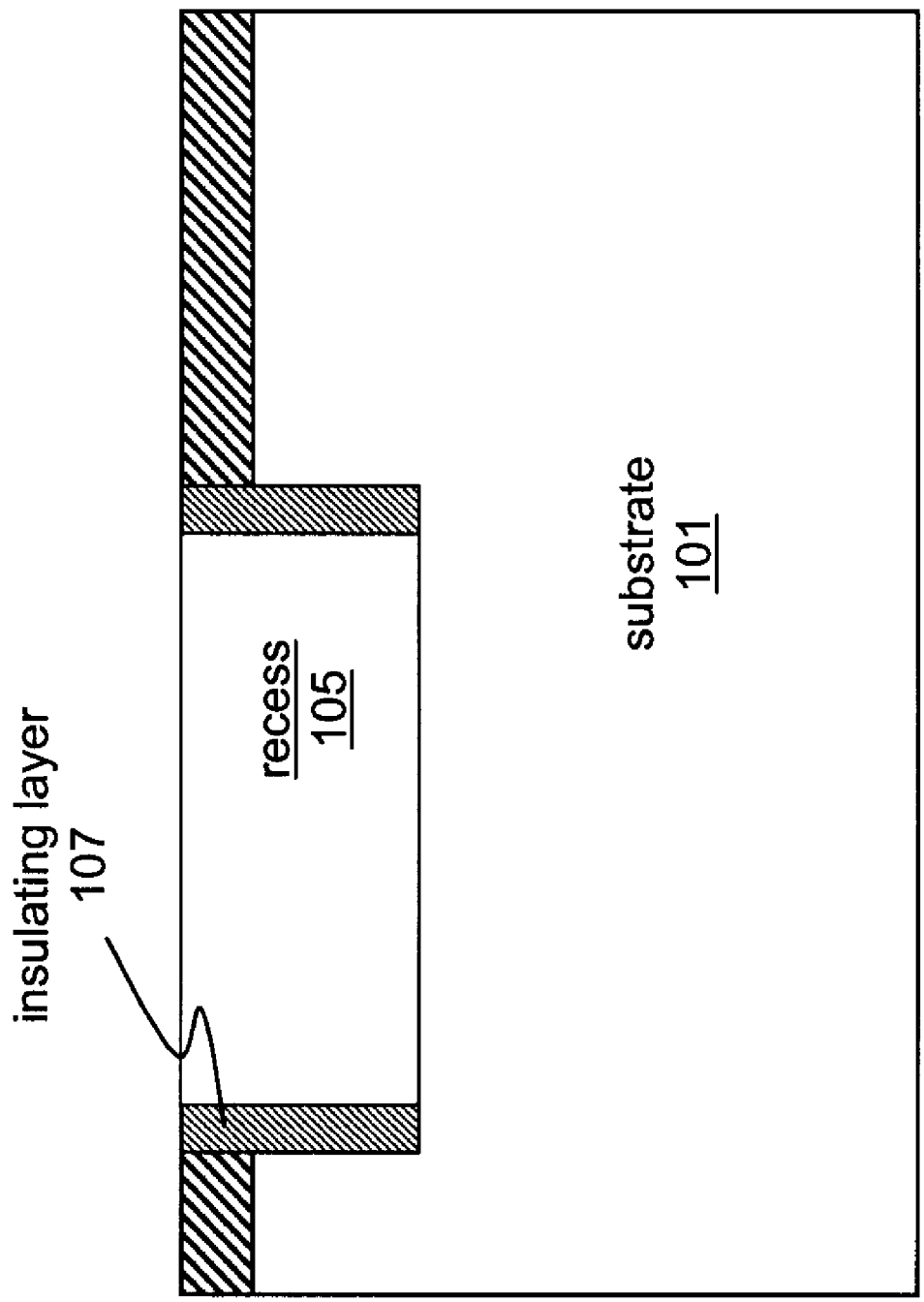
Figure 25:
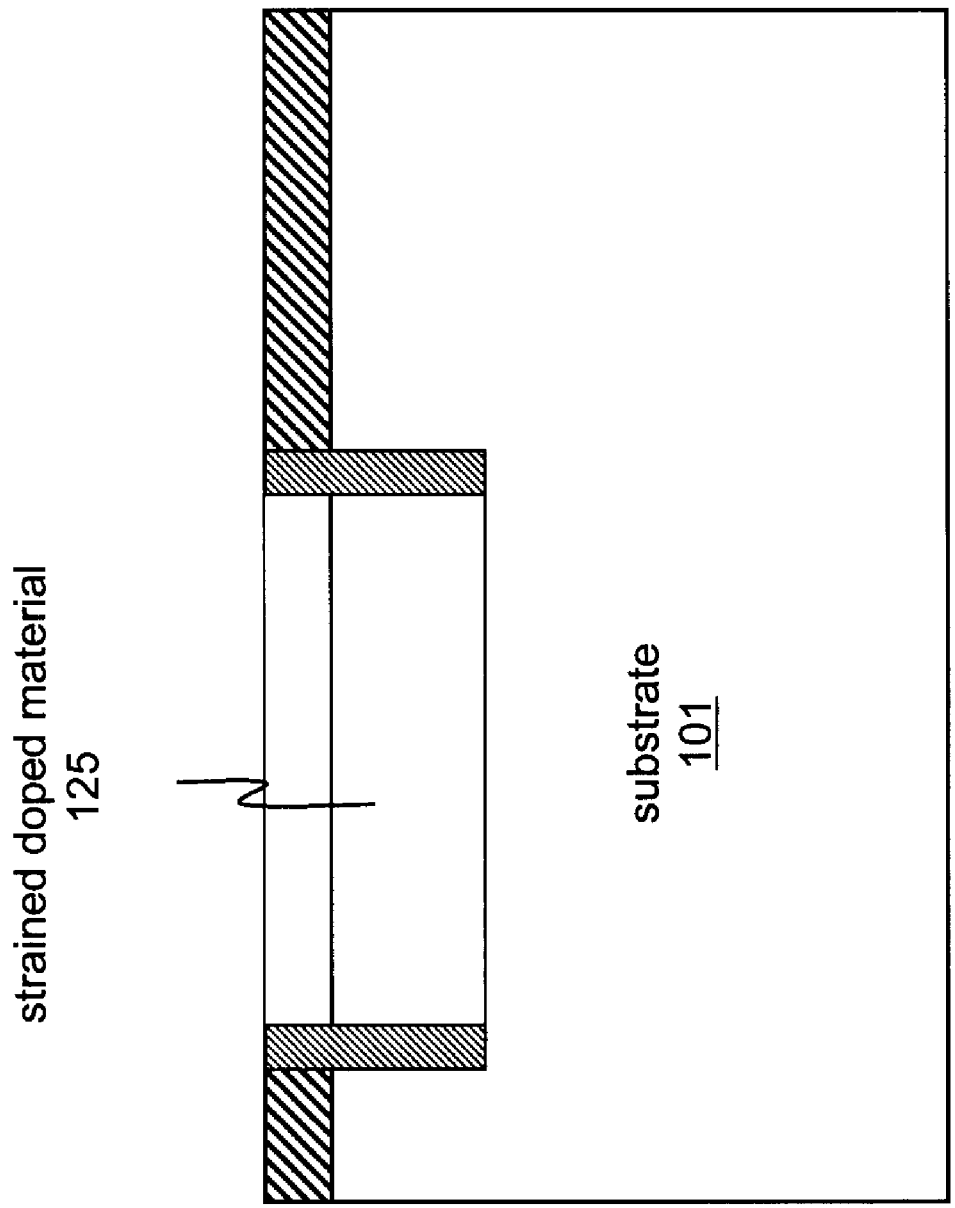

FIGS. 23-27 are cross-sectional views of an electrical device 100 that illustrate the formation of a strained material 125 using doped silicon on a substrate 101. As shown in FIG. 23, a pad layer 103 is formed on a silicon substrate 101. Then, as illustrated by FIG. 24, a recess 105 is etched through the pad layer and into the substrate 101 to an exemplary depth of approximately 0.05 or 1 microns, as measured from a top surface of the substrate 101. Thereafter, an optional insulating layer 107, formed of an oxide or a nitride material, is formed on the sidewalls of and bottom of the recess 105 using chemical vapor deposition or other known processes. Following an etching process to remove the insulating layer 107 from the bottom portion of the recess 105, a strained material 125 is epitaxially grown in the recess within the confines of the insulating material 107 until a top surface of the strained material approximately matches a top surface of the substrate 101. The strained layer 125 has a thickness less than the so-called "critical thickness". The critical thickness is defined as the maximum thickness of the strained layer below which virtually no defects are generated. Illustratively, the strained material 125 is carbon-doped silicon. However, other doped semiconductor materials may be used. For example, a compressive-strained layer may be formed by forming a germanium-doped silicon layer on silicon substrate.

Figure 26:
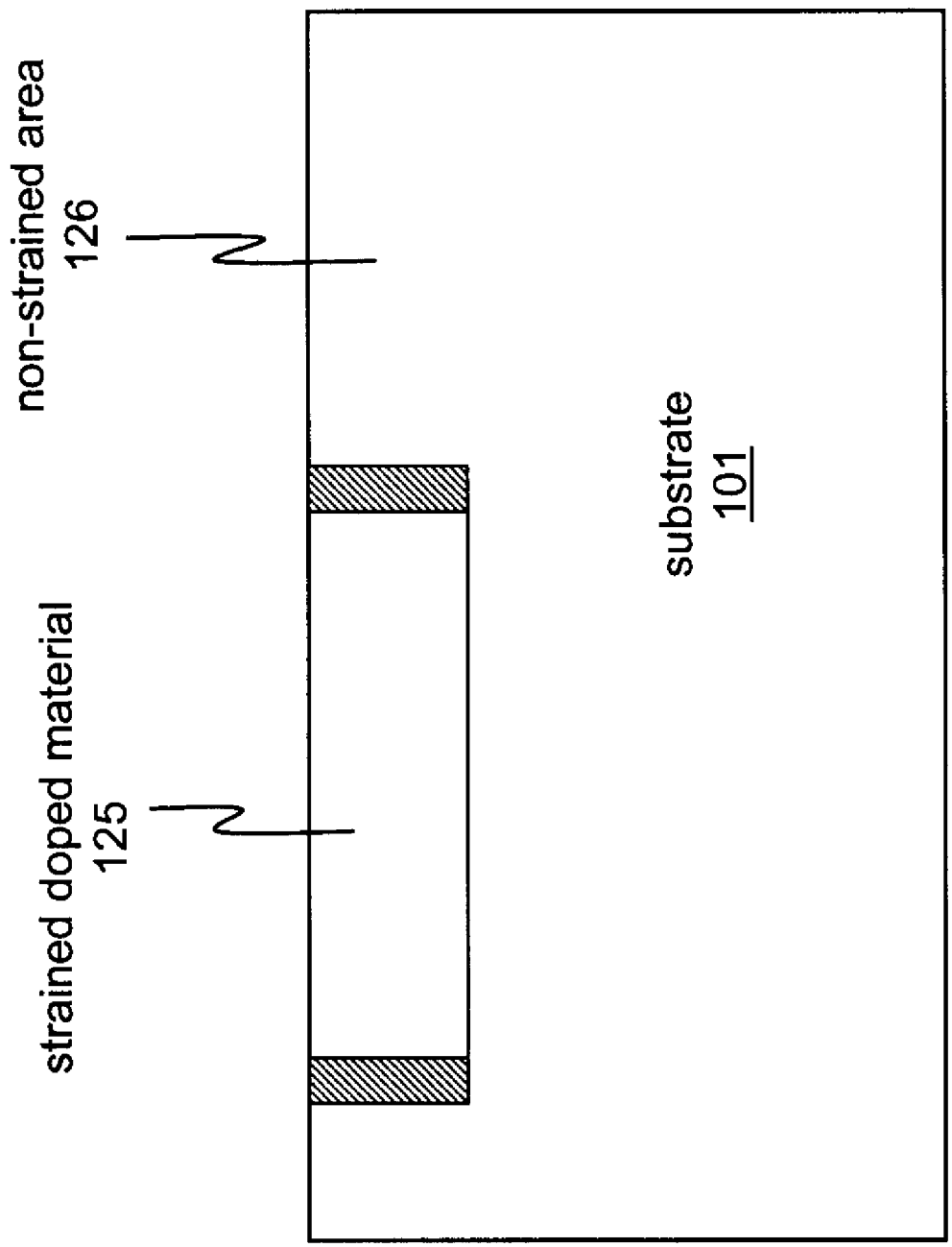
Figure 27:
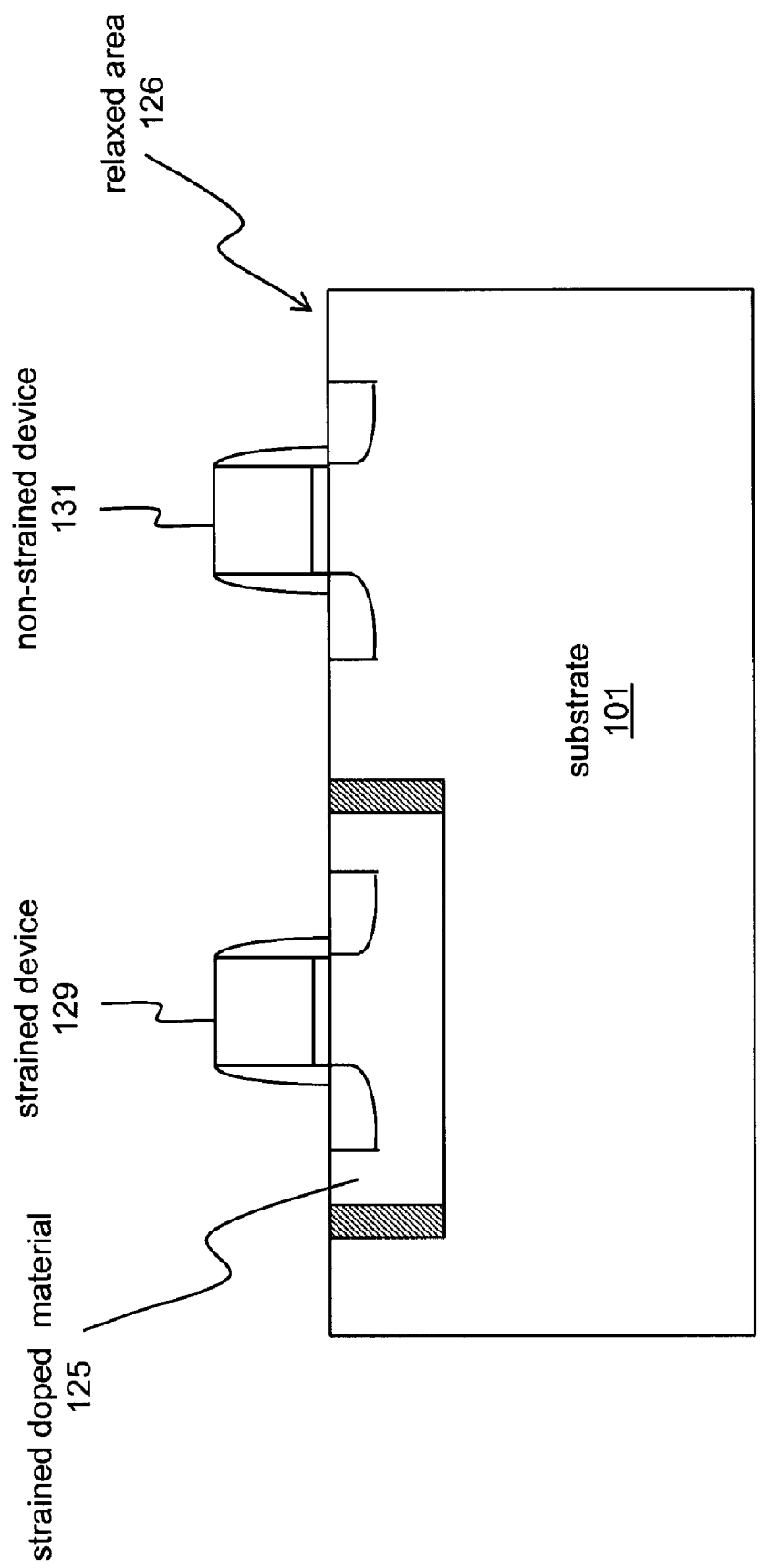
FIG. 27 shows a final structure of an electrical device according to a fifth embodiment of the invention.

FIG. 26 shows that the pad layer 103 has been etched away using either a dry or wet etch, as previously described, and that the top surface of the substrate 101 is planarized to be approximately level with the top surfaces of strained material 125, insulating layer 107 and the substrate 101. In this manner, strained material 125 is selectively formed in the recess 105 and separated from the non-strained areas 126 of the substrate 101 by the insulating layer 107. As shown in FIG. 27, a strained device 129, such as a logic device, is formed in the strained material 125; and a non-strained device 131 is formed in the non strained area 126 of the substrate 101.

Figure 28:
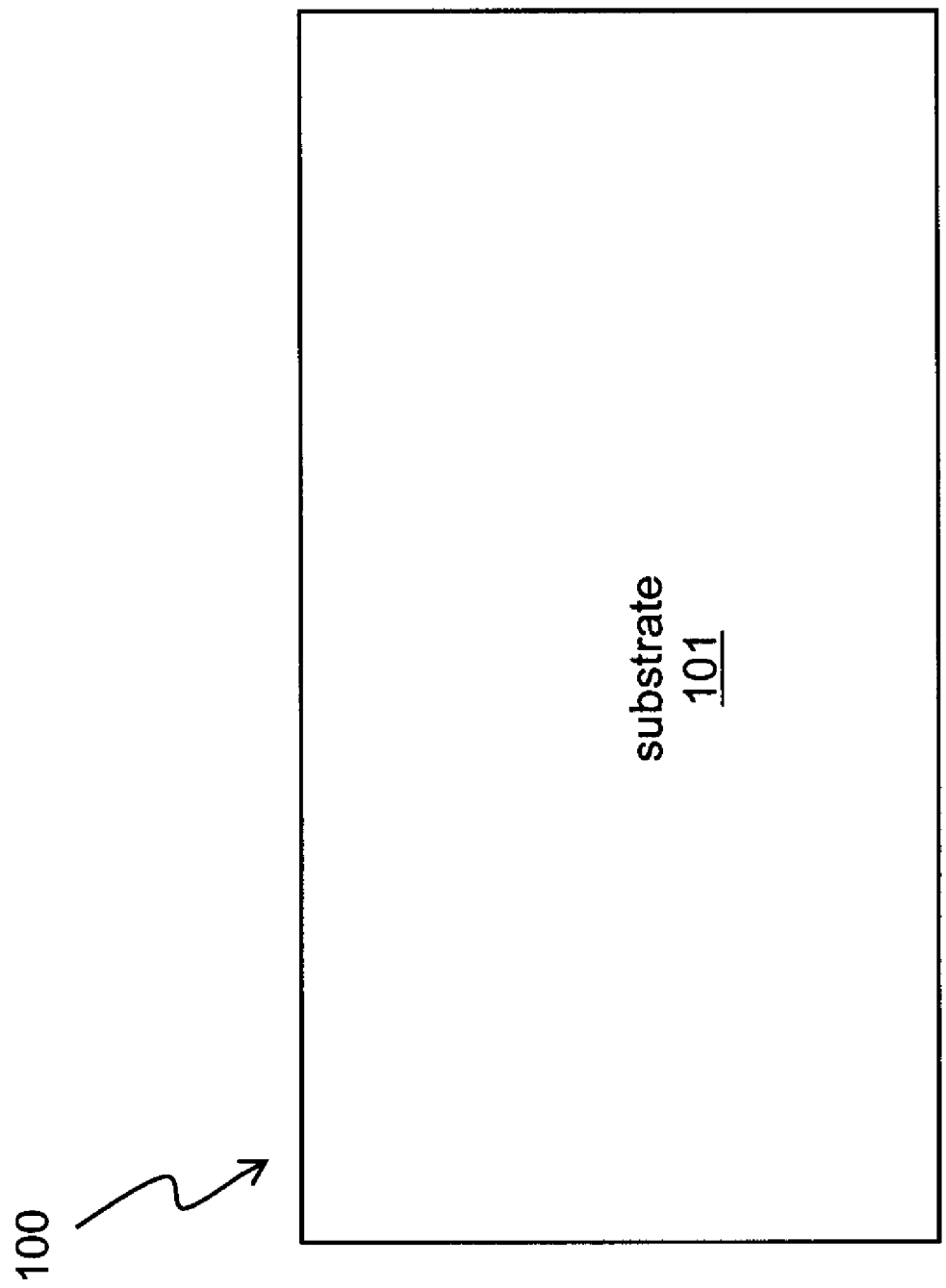
FIGS. 28-31 show fabricating steps of manufacturing an electrical device according to a sixth embodiment of the invention.
Figure 29:
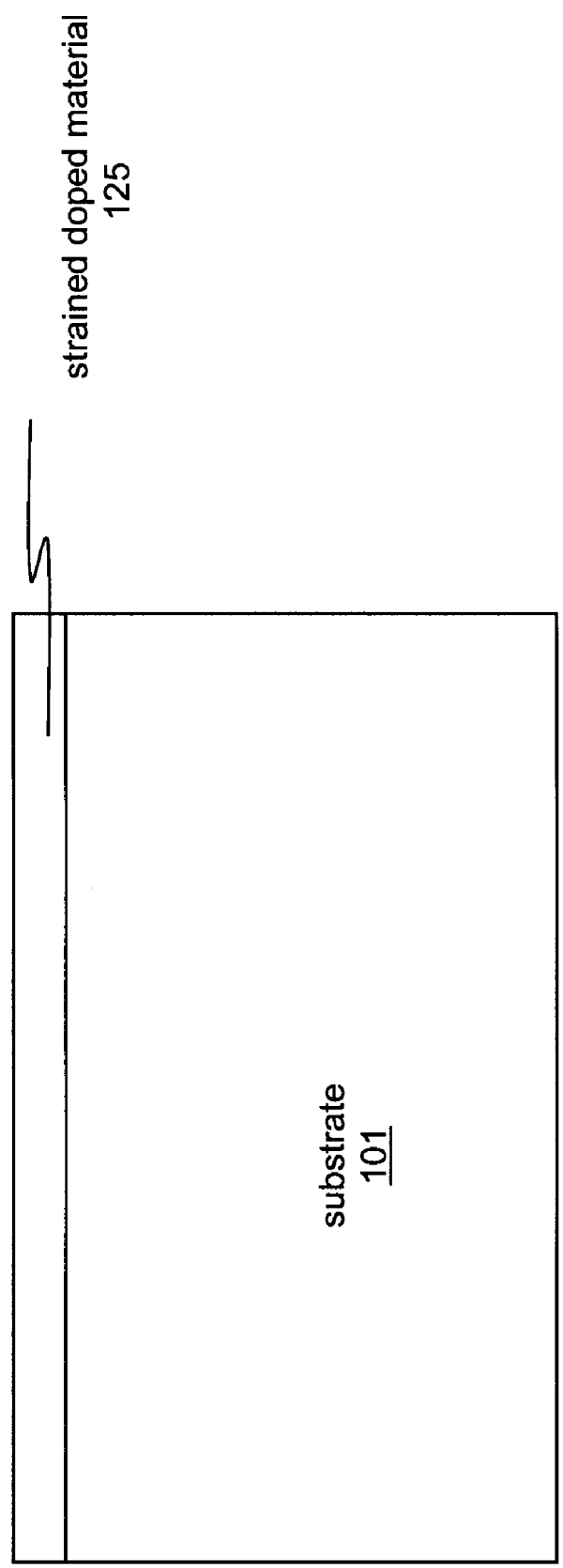

FIGS. 28-32 are cross-sectional views of an electrical device 100 that illustrate another formation of a strained material 125 using doped silicon on a silicon substrate 101. In FIG. 28, a silicon substrate 101 is prepared for processing. In FIG. 29, a carbon-doped strained material 125 is epitaxially grown on a top surface of the substrate 101. The strained layer 125 has a thickness less than the so-called "critical thickness". The critical thickness is defined as the maximum thick of the strained layer below which there is virtually no defects is generated. Illustratively, the strained material 125 is carbon-doped silicon. However, other doped semiconductor materials may be used. For example, a compressive-strained layer may be formed by forming a germanium-doped silicon layer on silicon substrate.

Figure 30:
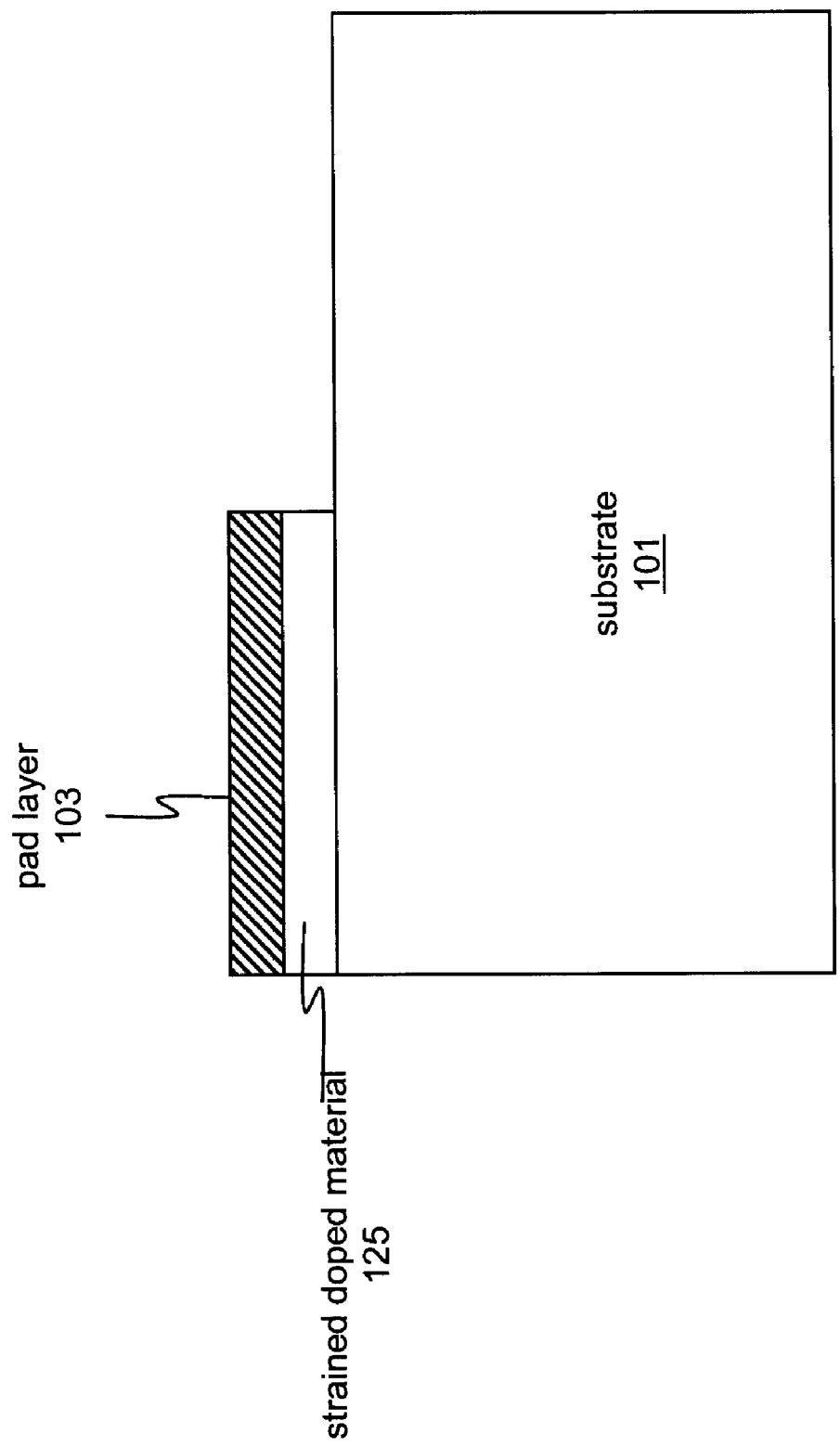

In FIG. 30, a patterned pad layer 103 is formed on the strained material 125. Areas of the non-strained silicon substrate are exposed by using an etching process to remove areas of strained doped material 125 that are not covered by the pad layer 103.

Figure 31:
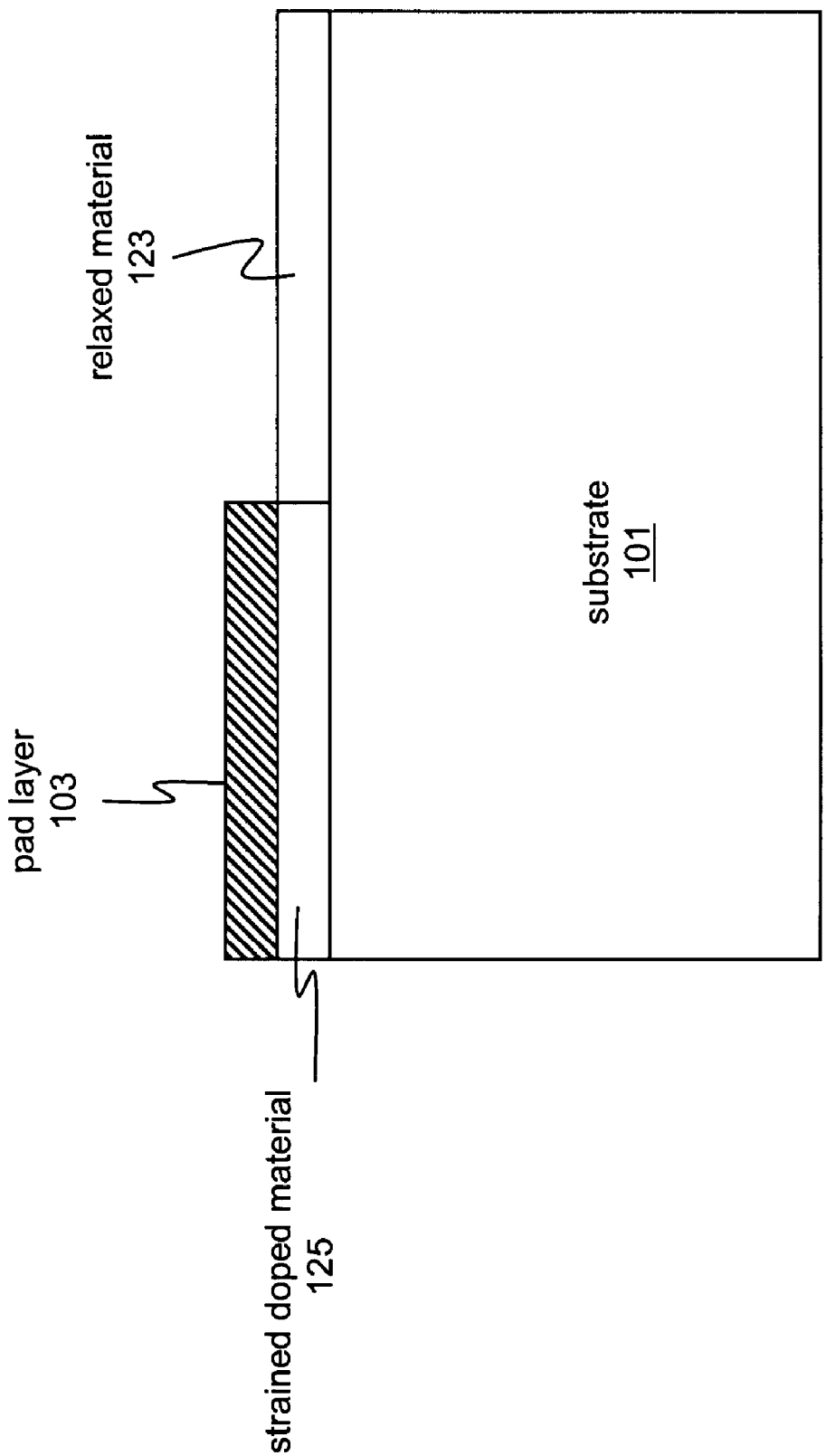
Figure 32:
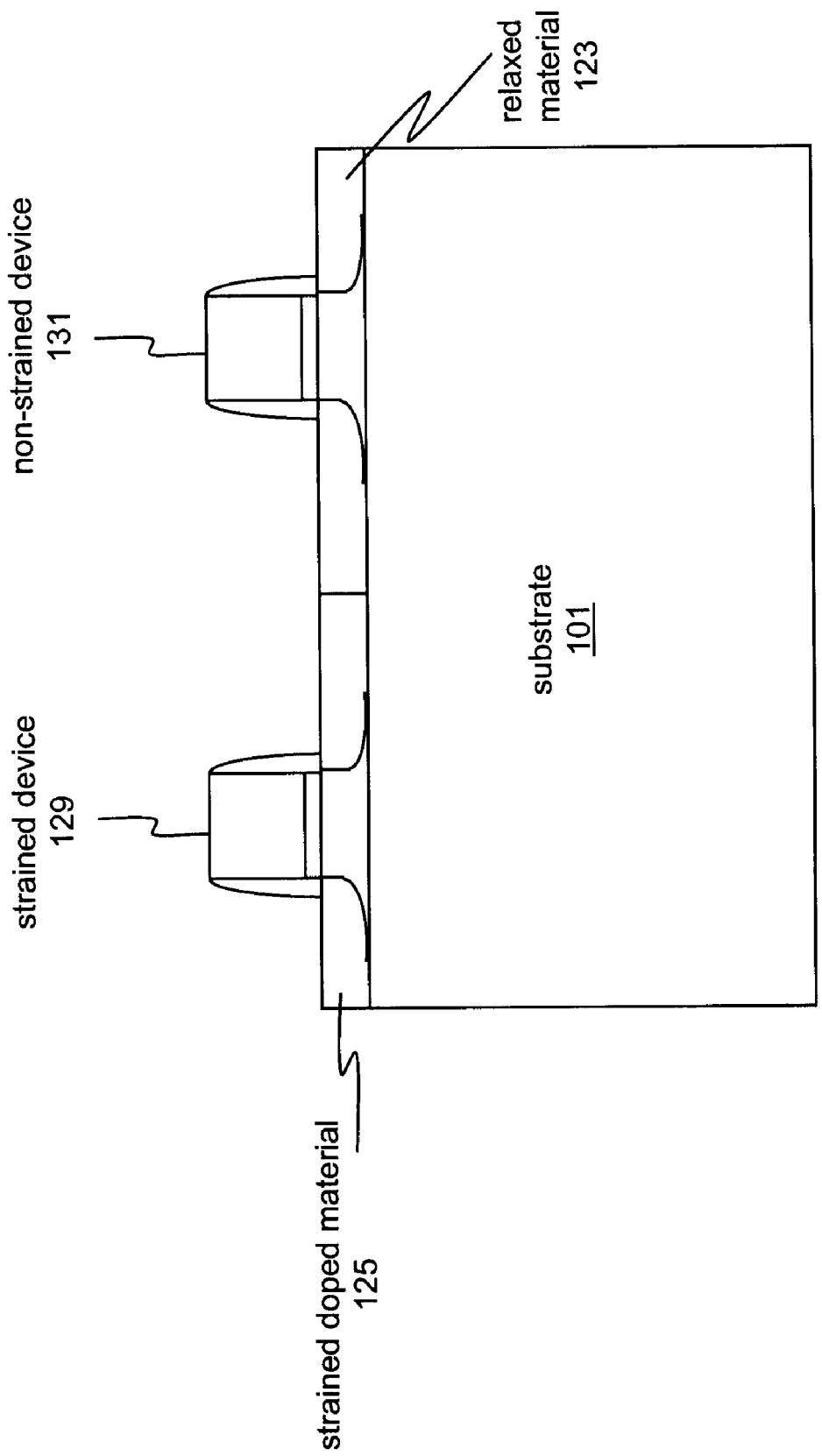
FIG. 32 shows a final structure of an electrical device according to a sixth embodiment of the invention.

In FIG. 31, a non-strained (relaxed) material 123 is epitaxially grown on the exposed areas of the substrate 101 to approximately the same height of the strained layer 125 to form a substantially planar top surface. Epitaxially growing the non-strained material 123 is optional, since the strained material 125, in this embodiment, is very thin (e.g., less than about 100 nanometers). Thereafter, as shown in FIG. 32, the pad layer 103 is etched away and a strained device 129 is formed in the strained material 125. A non-strained device 131 is formed in the relaxed material 123. Alternatively, if a relaxed material 123 is not used, the non-strained device 131 is formed in a non-strained area of the substrate 101. Again, permitting the strained material 125 to contact the adjacent relaxed material 123 usually does not pose problems because the lateral strain experienced by both materials is significantly less than the strain created by the doped semiconductor material that forms the strained material 125. Illustratively, the strained material 125 is carbon-doped silicon. However, other doped semiconductor materials may be used. For example, a compressive-strained layer may be formed by forming a germanium-doped silicon layer on silicon substrate.

Figure 33:
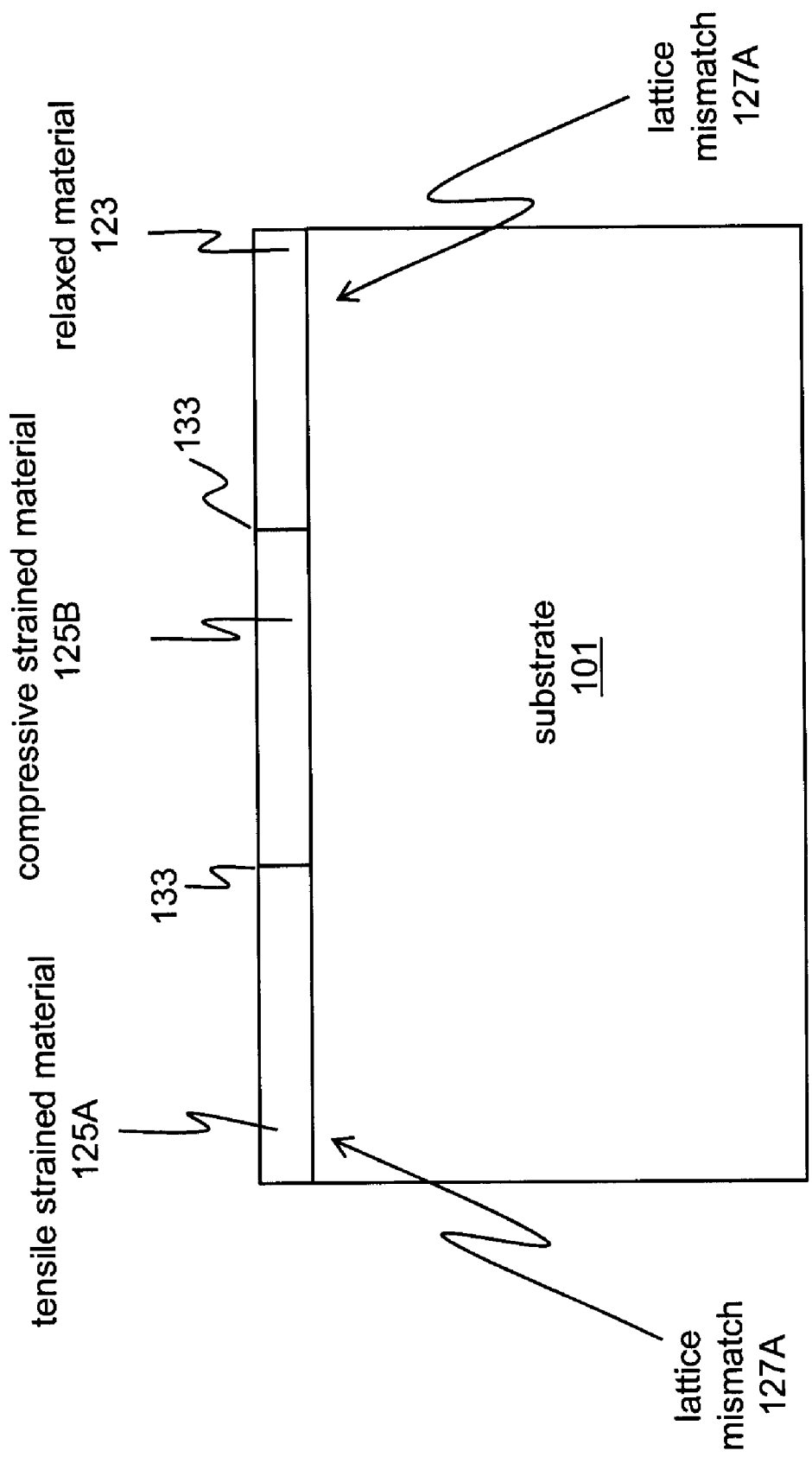
FIG. 33 is a cross-sectional view of an electrical device according to a seventh embodiment of the invention that is formed using a combination of the methods and materials shown in FIGS. 1-32.

FIG. 33 is a cross-sectional view illustrating an electrical device 100 having tensile-strained, compressive-strained, and non-strained materials 123, 124, and 123, respectively. As shown, each of these materials is formed on a surface of a substrate 101 using any combination of the techniques discussed above. The lateral strain experienced at junctions 133 is minimal compared to the vertical strain exerted by the lattice mismatches 127A and 127B, respectively. Alternatively, these layers may also be separated by insulating materials. In one embodiment, the tensile strained material 125A is a carbon-doped silicon layer formed on silicon and the compressive strained material 125B is a germanium-doped silicon layer formed on silicon. Alternatively, the tensile strained material 125A is a silicon layer formed on the SiGe buffer layer(s) (not shown) and the compressive strained material 125B is a silicon layer formed on SiC buffer layer(s) (not shown). Although illustratively shown as a layer, the relaxed material 123 may also be a relaxed top surface of the substrate 101, as previously illustrated and described with reference to FIGS. 31 and 32. Although illustratively shown that these layers have the same thickness, their thicknesses may not necessary be the same.

It should be understood that FIGS. 1-33 can equally represent methods of manufacture. In any event, FIGS. 34-39 show various methods for manufacturing the apparatus according to various aspects of the invention. Although herein described with reference to sequential reference numerals, the steps of each method may be performed in any order. The removing of layers to form a recess, forming layers and other processes may be provided by any known method of fabrication. For example, illustrative manufacturing processes include, but are not limited to, chemical vapor deposition, ultra-high vacuum chemical vapor deposition, and reactive ion etching (RIE), electrolytic etching, plasma etching, dry etching, and the like. Ion etching is a process of removing unwanted material by selectively bombarding an area or areas of a solid or liquid substance with energetic ionized particles. Often used in the manufacture of microelectronics, plasma etching creates reactive species in a plasma and then uses the reactive species to selectively remove unwanted material.

Figure 34:
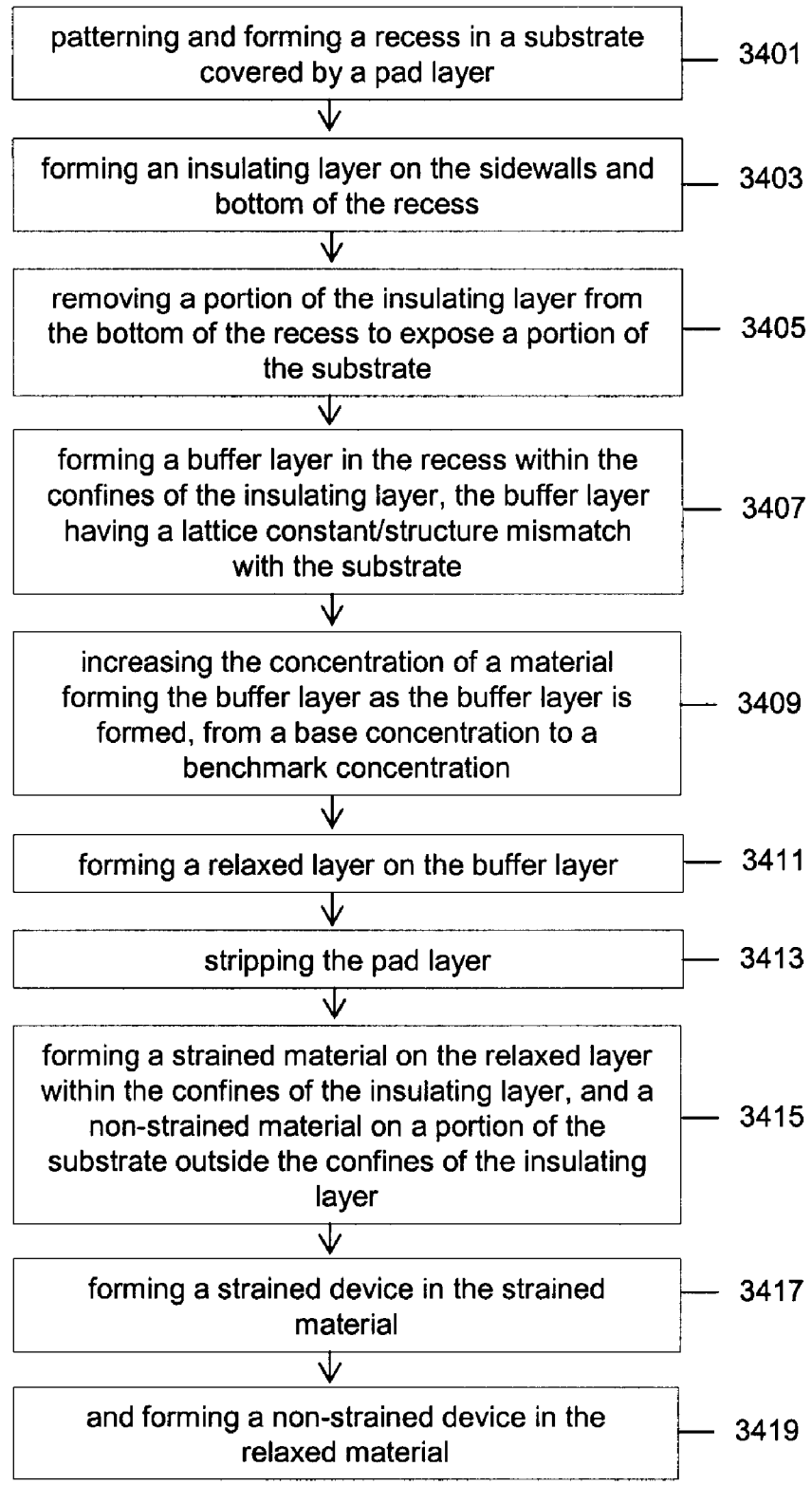
FIG. 34 is a flowchart representing fabricating steps of manufacturing the electrical device shown in FIGS. 1-5.

FIG. 34 is a flowchart illustrating an exemplary method of manufacturing an electrical device 100, according to one embodiment of the invention. At step 3401, a recess is patterned and formed in a substrate covered by a pad layer. At step 3403, an insulating layer is optionally formed on the sidewalls and bottom of the recess. At step 3405, a portion of the insulating layer is removed from the bottom of the recess to expose a portion of the sub-strate. At step 3407, a buffer layer is formed in the recess within the confines of the insulating layer, the buffer layer having a lattice constant/structure mismatch with the substrate. At step 3409 the concentration of a material forming the buffer layer is increased as the buffer layer is formed from a base concentration to a benchmark concentration. At step 3411, a relaxed layer is formed on the buffer layer. At step 3413, the pad layer is stripped. At step 3415, a strained material is formed on the relaxed layer within the confines of the insulating layer, and a non-strained material is formed on a portion of the sub-strate outside the confines of the insulating layer. At step 3417 a strained device is formed in the strained material. At step 3419 a non-strained device is formed in the relaxed material. In one embodiment, a material forming the relaxed layer has a second base concentration proximate a bottom surface thereof that approximately equals the benchmark concentration proximate a top surface of the buffer layer.

Figure 35:
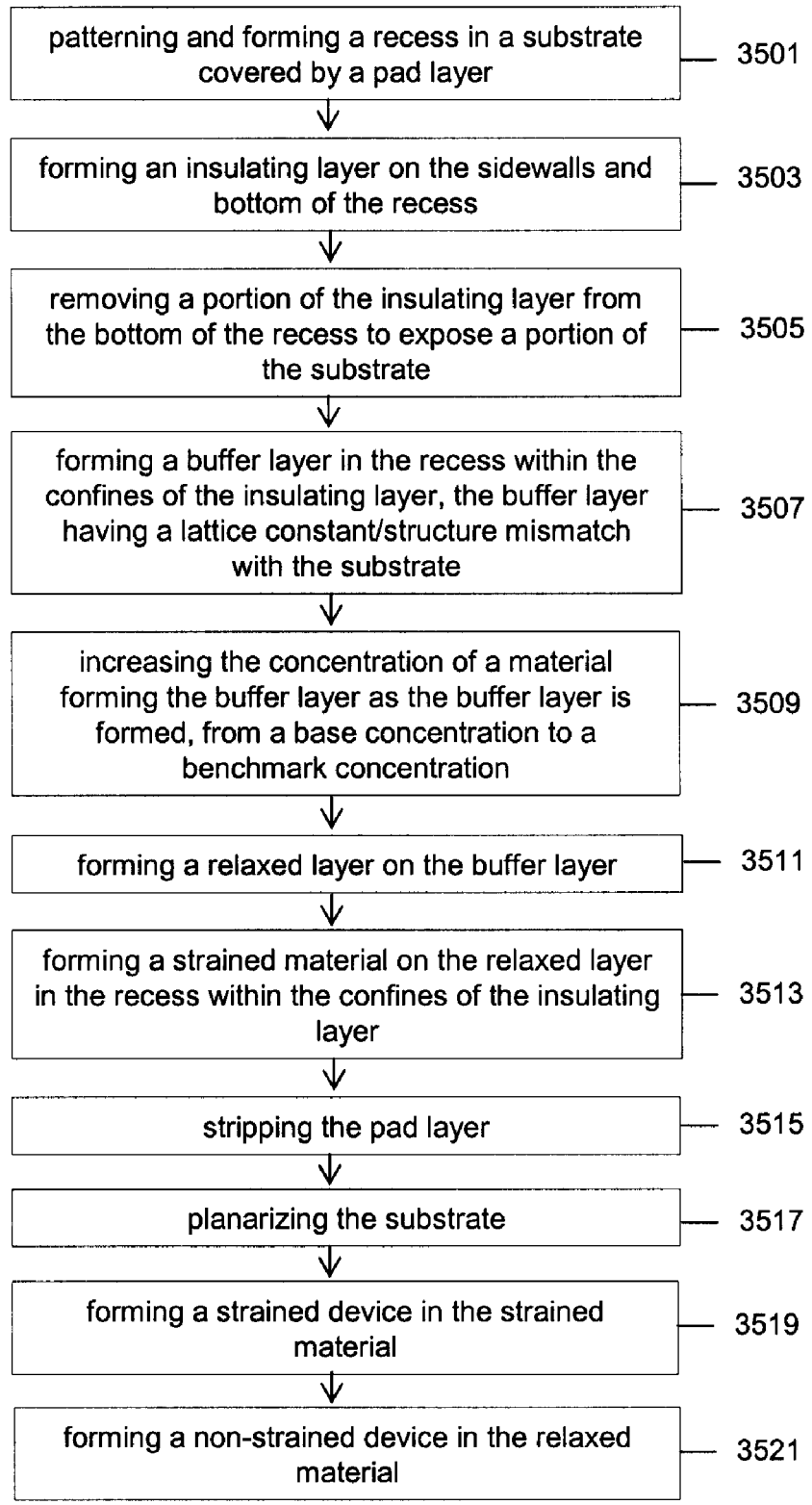
FIG. 35 is a flowchart representing fabricating steps of manufacturing the electrical device shown in FIGS. 6-11.

FIG. 35 is a flowchart illustrating an exemplary method of manufacturing an electrical device 100, according to one embodiment of the invention. At step 3501 a recess is patterned and formed in a substrate covered by a pad layer. At step 3503 an insulating layer is formed on the sidewalls and bottom of the recess. At step 3505, a portion of the insulating layer is removed from the bottom of the recess to expose a portion of the substrate. At step 3507, a buffer layer is formed in the recess within the confines of the insulating layer, the buffer layer having a lattice constant/structure mismatch with the substrate. At step 3509, the concentration of a material forming the buffer layer is increased as the buffer layer is formed, from a base concentration to a benchmark concentration. At step 3511 a relaxed layer is formed on the buffer layer. At step 3513 a strained material is formed on the relaxed layer in the recess within the confines of the insulating layer. At step 3515, the pad layer is stripped. At step 3517 the substrate is planarized. At step 3519 a strained device is formed in the strained material. At step 3521 a non-strained device is formed in the relaxed material. In one embodiment, a material forming the relaxed layer has a second base concentration proximate a bottom surface thereof that approximately equals the benchmark concentration proximate a top surface of the buffer layer.

Figure 36:
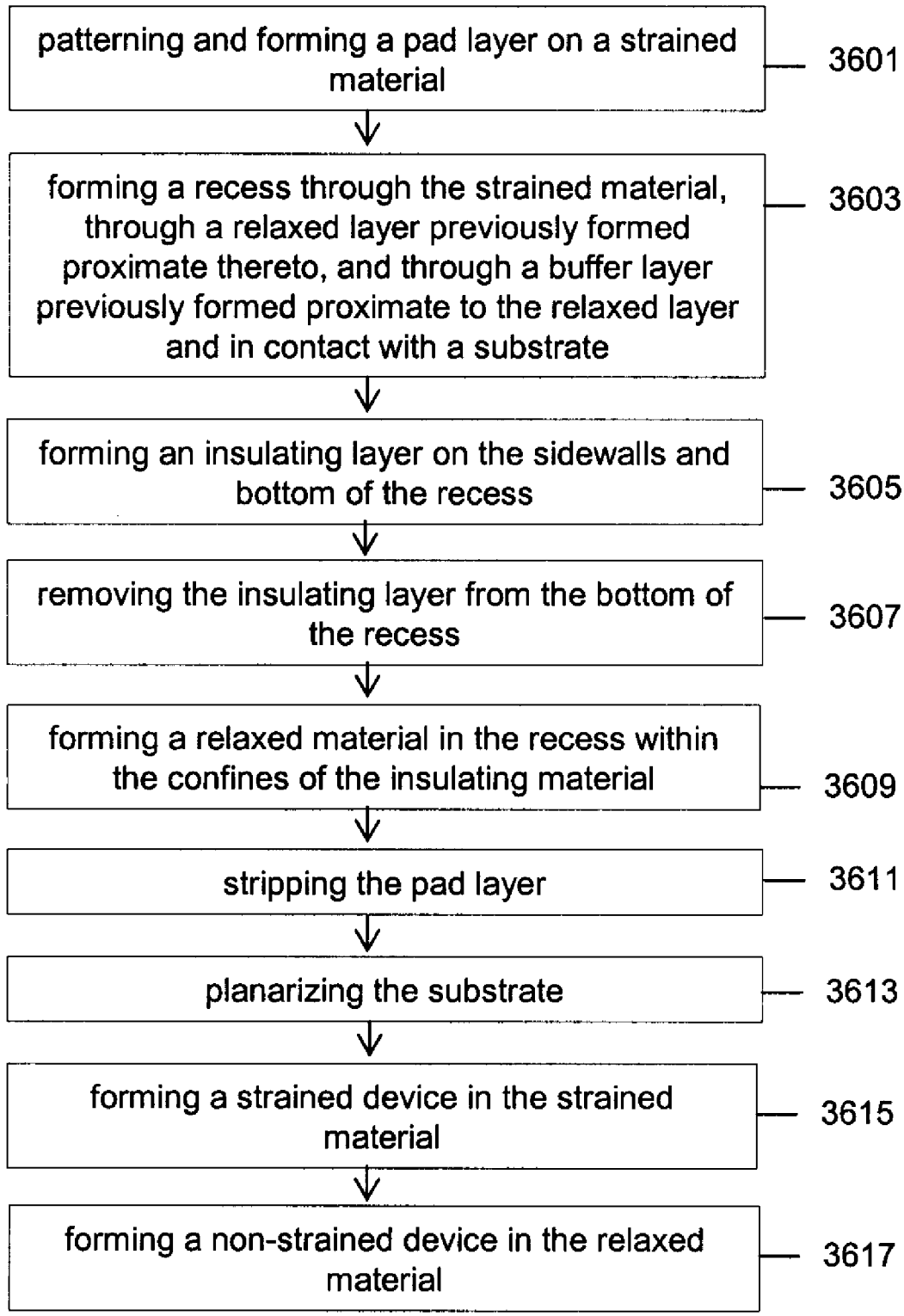
FIG. 36 is a flowchart representing fabricating steps of manufacturing the electrical device shown in FIGS. 12-16.

FIG. 36 is a flowchart illustrating an exemplary method of manufacturing an electrical device 100, according to one embodiment of the invention. At step 3601 a pad layer is formed on a strained material. At step 3603, a recess is patterned and formed through the strained material, through a relaxed layer previously formed proximate thereto, and through a buffer layer previously formed proximate to the relaxed layer and in contact with a sub-strate. At step 3605 an insulating layer is formed on the sidewalls and bottom of the recess. At step 3607 the insulating layer is removed from the bottom of the recess. At step 3609, a relaxed material is formed in the recess within the confines of the insulating material. At step 3611, the pad layer is stripped. At step 3613, the sub-strate is planarized. At step 3615, a strained device is formed in the strained material. At step 3617 a non-strained device is formed in the relaxed material.

Figure 37:
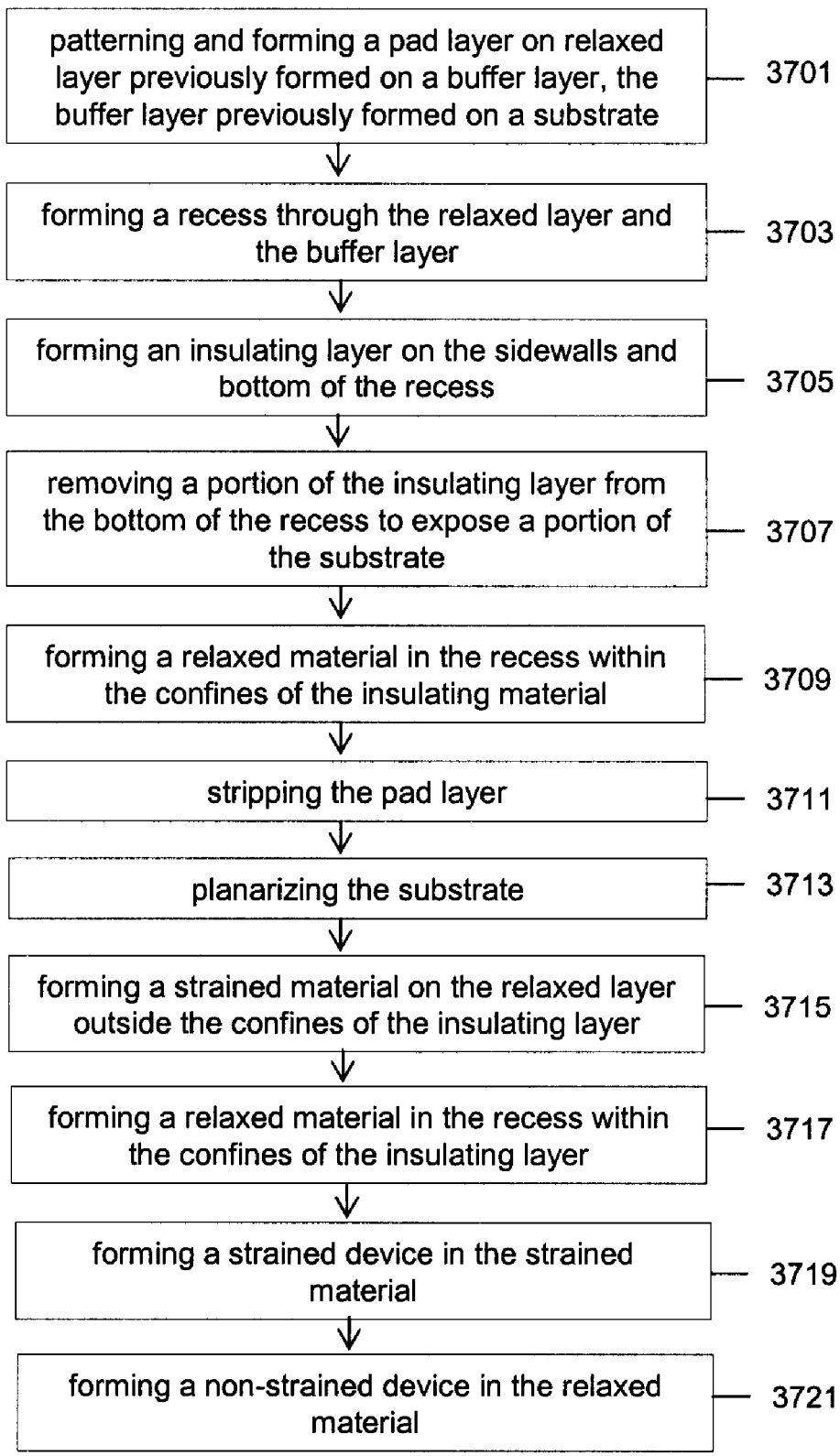
FIG. 37 is a flowchart representing fabricating steps of manufacturing the electrical device shown in FIGS. 17-22.

FIG. 37 is a flowchart illustrating an exemplary method of manufacturing an electrical device 100, according to one embodiment of the invention. At step 3701 a pad layer is patterned and formed on a relaxed layer previously formed on a buffer layer, the buffer layer being previously formed on a substrate. At step 3703 a recess is formed through the relaxed layer and the buffer layer. At step 3705 an insulating layer is formed on the sidewalls and bottom of the recess. At step 3707 a portion of the insulating layer is removed from the bottom of the recess to expose a portion of the substrate. At step 3709 a relaxed material in the recess within the confines of the insulating material. At step 3711 the pad layer is stripped. At step 3713 the substrate is planarized. At step 3715 a strained material is formed on the relaxed layer outside the confines of the insulating layer. At step 3717, a relaxed material is formed in the recess within the confines of the insulating layer. At step 3719, a strained device is formed in the strained material. At step 3721, a non-strained device is formed in the relaxed material.

Figure 38:
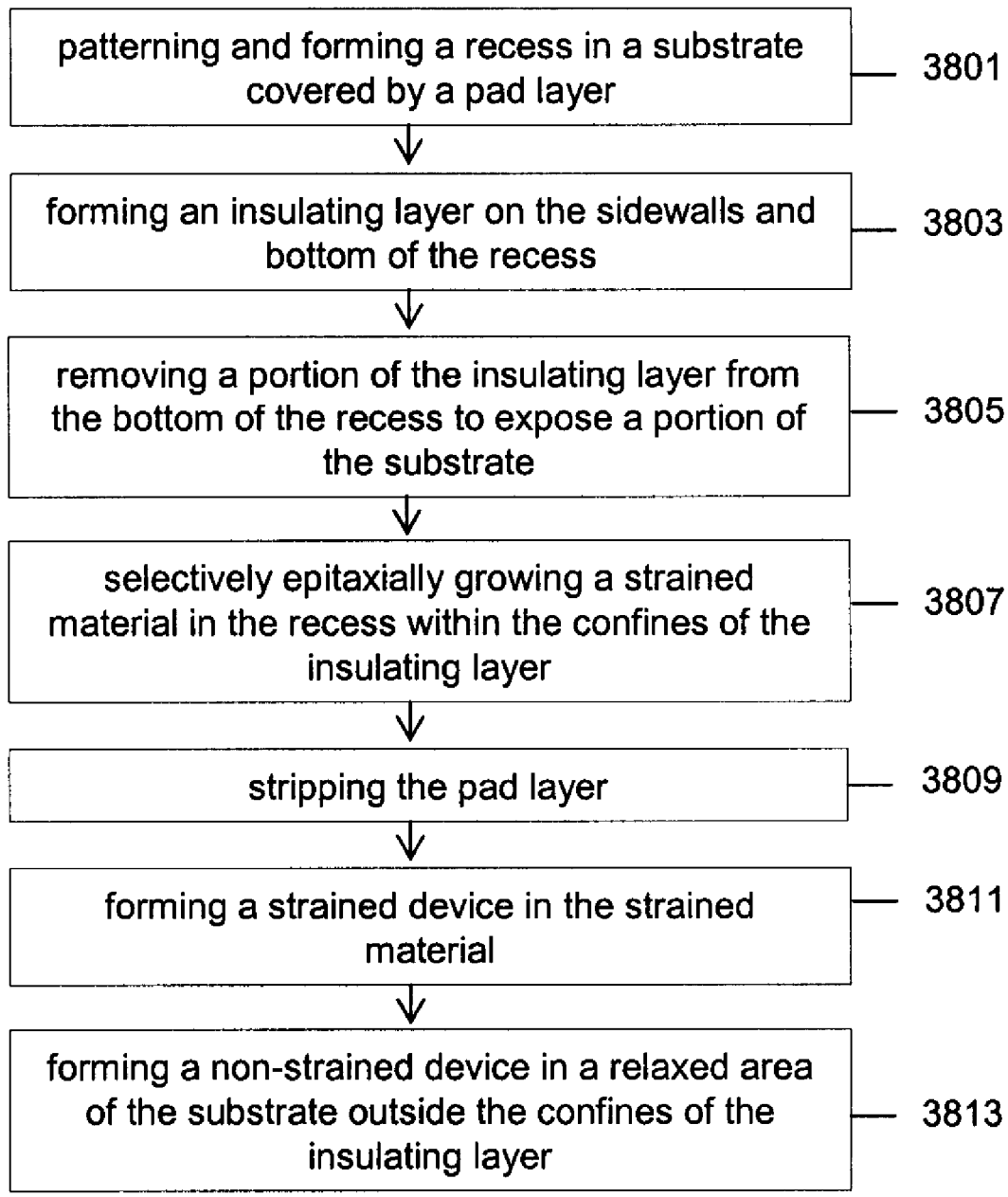
FIG. 38 is a flowchart representing fabricating steps of manufacturing the electrical device shown in FIGS. 23-27.

FIG. 38 is a flowchart illustrating an exemplary method of manufacturing an electrical device 100, according to one embodiment of the invention. At step 3801 a recess is patterned and formed in a substrate covered by a pad layer. At step 3803 an insulating layer is formed on the sidewalls and bottom of the recess. At step 3805 a portion of the insulating layer from the bottom of the recess to expose a portion of the substrate. At step 3807 a strained material is selectively and epitaxially grown in the recess within the confines of the insulating layer. At step 3809, the pad layer is stripped. At step 3811, a strained device is formed in the strained material. At step 3813 a non-strained device is formed in a relaxed area of the substrate outside the confines of the insulating layer. In this embodiment, the strained material may be a carbon-doped material, such as, but not limited to, carbon-doped silicon. Alternatively, the strained material may be a germanium-doped material, such as, not limited to, germanium-doped silicon.

Figure 39:
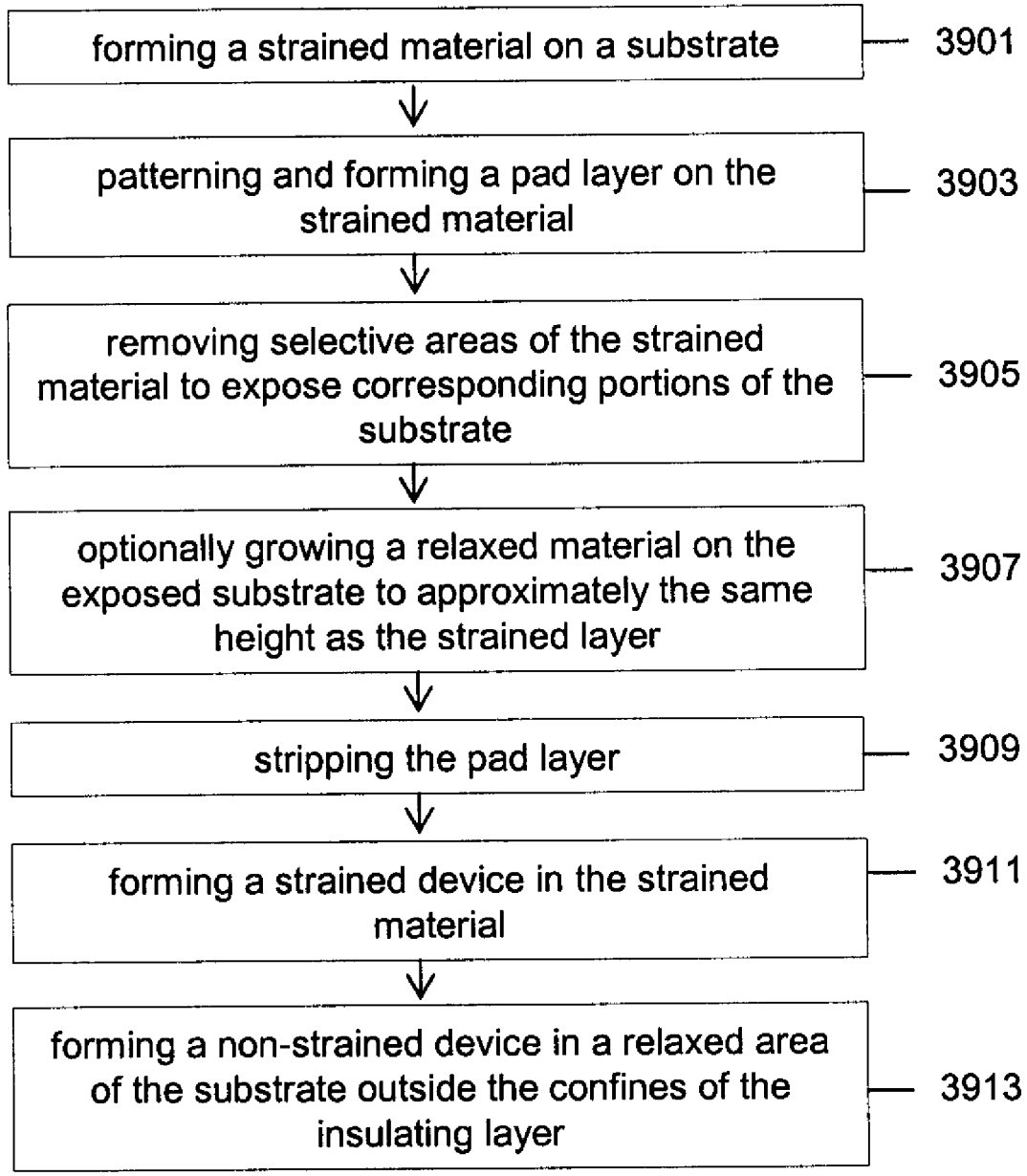
FIG. 39 is a flowchart representing fabricating steps of manufacturing the electrical device shown in FIGS. 28-32.

FIG. 39 is a flowchart illustrating an exemplary method of manufacturing an electrical device 100, according to one embodiment of the invention. At step 3901 a strained material is formed on a substrate. At step 3903 a pad layer is formed on the strained material. At step 3905, selective areas of the strained material are removed to expose corresponding portions of the substrate. At step 3907 a relaxed material is optionally grown on the exposed substrate to approximately the same height as the strained layer. At step 3909 the pad layer is stripped. At step 3911 a strained device is formed in the strained material. At step 3913 a non-strained device is formed in the relaxed material. In this embodiment, the strained material may be a carbon-doped material, such as, but not limited to, carbon-doped silicon.

Although embodiments of the invention have been illustrated in FIGS. 1-22 as fusing SiGe to form a tensile-strained material 125, it will be appreciated that other materials, such as SiC, may be substituted for SiGe, where it is desired to form a compressive-strained material 125. Additionally, a tensile-strained material 125 may be formed by epitaxially growing carbon-doped silicon on a silicon substrate. Other materials such as gallium phosphorus, gallium arsenic and the like, may also be substituted for SiGe, depending on desired applications and requested costs. As herein described, an electrical device formed in accordance with an embodiment of the invention may have a non-strained (relaxed) material 123, 124, 126 patterned proximate a strained material 125, 125A and 125B, as illustratively shown and described with respect to FIGS. 4, 15, 21, 26, 31 and 33.

While some exemplary embodiments of this invention have been described in detail, those skilled in the art will recognize that there are many possible modifications and variations which may be made in these exemplary embodiments while yet retaining many of the novel features and advantages of the invention.

The invention claimed is:

1. A method, comprising:
forming a pattern of strained material and relaxed material on a substrate;
forming a strained device in the strained material; and
forming a non-strained device in the relaxed material,
wherein the step of forming a pattern of strained material and relaxed material on a substrate further comprises:
forming a recess in the substrate, the recess having sidewalls;
forming a buffer layer in the recess which has a lattice constant/structure mismatch with the substrate;
forming a relaxed layer on the buffer layer;
forming the strained material on the relaxed layer and the relaxed material on the substrate, wherein the relaxed layer has a lattice constant/structure mismatch with the strained material.

2. The method of claim 1, further comprising forming an insulating layer on the sidewalls before forming the buffer layer.

3. The method of claim 1 wherein the relaxed layer and the buffer layer are each selected from the group consisting of silicon carbon (SiC), silicon germanium (SiGe), $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity), and $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

4. The method of claim 1, wherein the strained material and the relaxed material are each selected from one of the group consisting of silicon (Si), silicon carbon (SiC), silicon germanium (SiGe), $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1Y2Y3Y4=1, and $Zn_{A1}Cd_{A2}Se_{B1}Te_{B2}$, where A1, A 2, B1, and B2 are relative proportions each greater than or equal to zero and A1+A2+B1+B2=1.

5. The method of claim 1, wherein the step of forming the buffer layer further comprises:
epitaxially growing multiple layers of a material forming the buffer layer such that the material forming the buffer layer has a base concentration proximate the substrate and an increased benchmark concentration proximate the relaxed layer.

6. The method of claim 5, wherein the step of forming the relaxed layer further comprises:
epitaxially growing multiple layers of a material forming the relaxed layer such that the material forming the relaxed layer has a second base concentration proximate the buffer layer that approximately equals the bench-mark concentration of the buffer layer material.

* * * * *